(12) United States Patent
Heo et al.

(10) Patent No.: US 9,875,992 B2
(45) Date of Patent: Jan. 23, 2018

(54) SEMICONDUCTOR PACKAGE HAVING STACKED CHIPS AND A HEAT DISSIPATION PART AND METHOD OF FABRICATING THE SAME

(71) Applicants: Junyeong Heo, Suwon-si (KR); Chajea Jo, Incheon (KR); Taeje Cho, Yongin-si (KR)

(72) Inventors: Junyeong Heo, Suwon-si (KR); Chajea Jo, Incheon (KR); Taeje Cho, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/821,767

(22) Filed: Aug. 9, 2015

(65) Prior Publication Data

US 2016/0079208 A1 Mar. 17, 2016

(30) Foreign Application Priority Data

Sep. 11, 2014 (KR) .................. 10-2014-0120307

(51) Int. Cl.
*H01L 23/00* (2006.01)
*H01L 23/367* (2006.01)
(Continued)

(52) U.S. Cl.
CPC ...... *H01L 25/0657* (2013.01); *H01L 23/3677* (2013.01); *H01L 23/544* (2013.01); *H01L 24/14* (2013.01); *H01L 24/17* (2013.01); *H01L 25/50* (2013.01); *H01L 23/481* (2013.01); *H01L 23/49827* (2013.01); *H01L 24/03* (2013.01); *H01L 24/05* (2013.01); *H01L 24/06* (2013.01);
(Continued)

(58) Field of Classification Search
CPC ....... H01L 25/0657; H01L 2224/16145; H01L 23/481; H01L 2224/14515–2224/14519; H01L 2224/17515–2224/17519; H01L 2224/0557; H01L 2224/32145–2224/32148; H01L 21/563
See application file for complete search history.

(56) References Cited

U.S. PATENT DOCUMENTS 4,764,804 A * 8/1988 Sahara ............... H01L 23/24
174/16.3
8,048,794 B2 11/2011 Knickerbocker
(Continued)

FOREIGN PATENT DOCUMENTS

| JP | H11121643 A | 4/1999 |
|---|---|---|
| KR | 10-1056750 B1 | 8/2011 |
| KR | 20120005185 A | 1/2012 |

*Primary Examiner* — Kevin Parendo
(74) *Attorney, Agent, or Firm* — Renaissance IP Law Group LLP

(57) ABSTRACT

An embodiment includes a semiconductor package comprising: a substrate; a first semiconductor chip mounted on the substrate; a second semiconductor chip mounted on a top surface of the first semiconductor chip; a connecting bump disposed between the first and second semiconductor chips to electrically connect the second semiconductor chip to the first semiconductor chip; and a first heat dissipation part disposed on the top surface of the first semiconductor chip between the first and second semiconductor chips and spaced apart from a bottom surface of the second semiconductor chip.

15 Claims, 20 Drawing Sheets

(51) Int. Cl.
*H01L 23/498* (2006.01)
*H01L 23/544* (2006.01)
*H01L 25/065* (2006.01)
*H01L 25/00* (2006.01)
*H01L 23/48* (2006.01)

(52) U.S. Cl.
CPC ............... *H01L 24/11* (2013.01); *H01L 24/13* (2013.01); *H01L 24/16* (2013.01); *H01L 24/29* (2013.01); *H01L 24/32* (2013.01); *H01L 24/33* (2013.01); *H01L 24/81* (2013.01); *H01L 24/83* (2013.01); *H01L 24/92* (2013.01); *H01L 24/94* (2013.01); *H01L 2223/5442* (2013.01); *H01L 2223/5448* (2013.01); *H01L 2223/54426* (2013.01); *H01L 2224/0361* (2013.01); *H01L 2224/0401* (2013.01); *H01L 2224/0557* (2013.01); *H01L 2224/05624* (2013.01); *H01L 2224/05647* (2013.01); *H01L 2224/05655* (2013.01); *H01L 2224/06181* (2013.01); *H01L 2224/1403* (2013.01); *H01L 2224/14131* (2013.01); *H01L 2224/14136* (2013.01); *H01L 2224/14177* (2013.01); *H01L 2224/14179* (2013.01); *H01L 2224/14505* (2013.01); *H01L 2224/14519* (2013.01); *H01L 2224/16145* (2013.01); *H01L 2224/16227* (2013.01); *H01L 2224/1703* (2013.01); *H01L 2224/17051* (2013.01); *H01L 2224/17177* (2013.01); *H01L 2224/17181* (2013.01); *H01L 2224/2919* (2013.01); *H01L 2224/32145* (2013.01); *H01L 2224/32148* (2013.01); *H01L 2224/32225* (2013.01); *H01L 2224/33181* (2013.01); *H01L 2224/73204* (2013.01); *H01L 2224/73253* (2013.01); *H01L 2224/8113* (2013.01); *H01L 2224/83104* (2013.01); *H01L 2224/92125* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/06593* (2013.01); *H01L 2924/15311* (2013.01)

(56) References Cited

U.S. PATENT DOCUMENTS

| | | | |
|---|---|---|---|
| 8,263,434 B2 | 9/2012 | Pagaila et al. | |
| 8,526,186 B2 | 9/2013 | Yokoya et al. | |
| 8,581,419 B2 | 11/2013 | Su et al. | |
| 8,642,381 B2 | 2/2014 | Pagaila et al. | |
| 8,674,510 B2 | 3/2014 | Law et al. | |
| 2003/0146012 A1* | 8/2003 | Song | H01L 25/0657 174/538 |
| 2010/0333056 A1* | 12/2010 | Emma | G06F 17/5072 716/119 |
| 2011/0024888 A1 | 2/2011 | Pagaila et al. | |
| 2011/0042820 A1 | 2/2011 | Knickerbocker | |
| 2012/0012990 A1 | 1/2012 | Pagaila et al. | |
| 2012/0025388 A1 | 2/2012 | Law et al. | |
| 2012/0139092 A1 | 6/2012 | Su et al. | |
| 2012/0282735 A1* | 11/2012 | Ahn | H01L 21/76898 438/109 |
| 2013/0016477 A1 | 1/2013 | Yokoya et al. | |
| 2013/0277821 A1 | 10/2013 | Lundberg | |
| 2014/0134804 A1 | 5/2014 | Kelly et al. | |
| 2015/0048493 A1* | 2/2015 | Min | H01L 24/83 257/712 |

\* cited by examiner

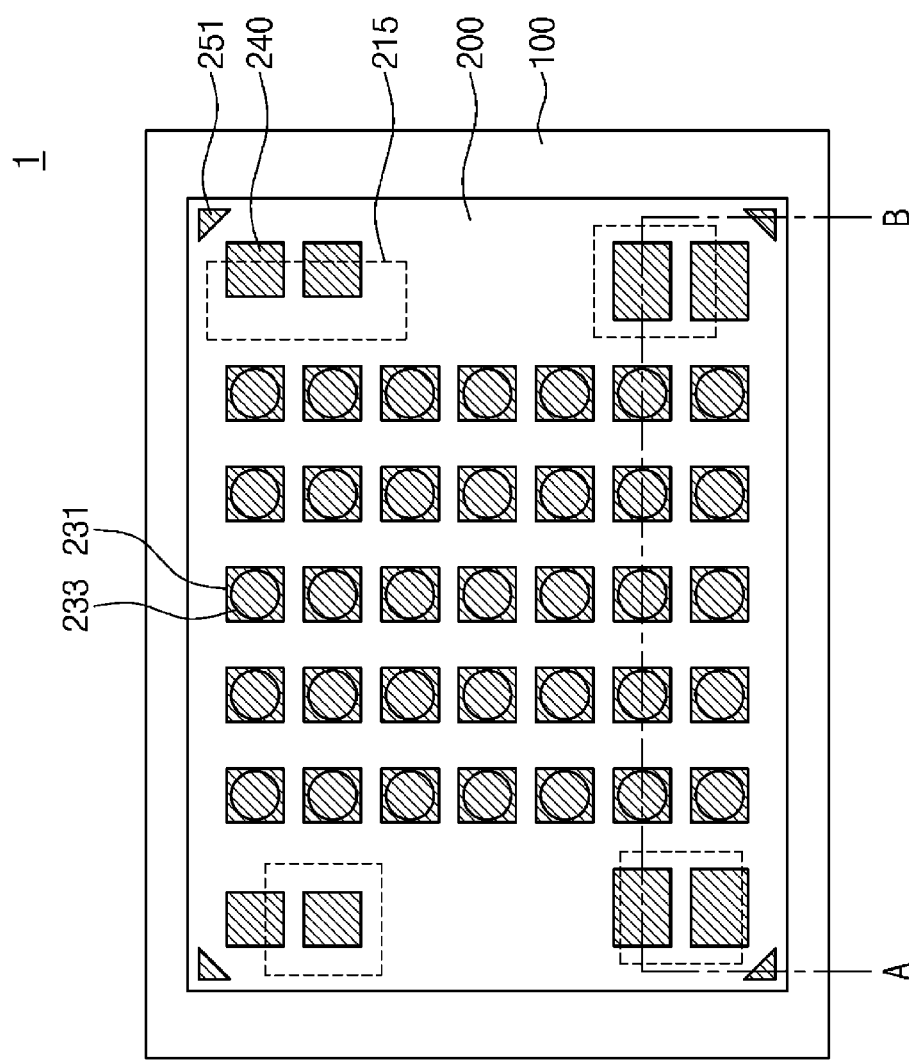

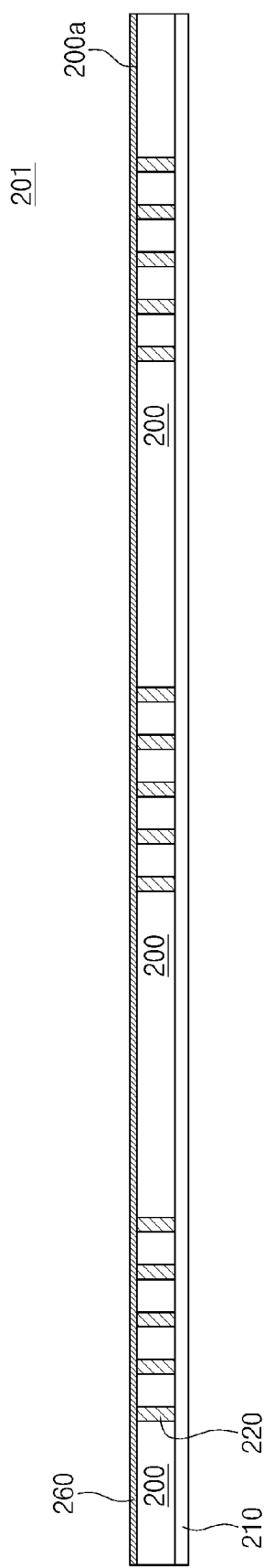
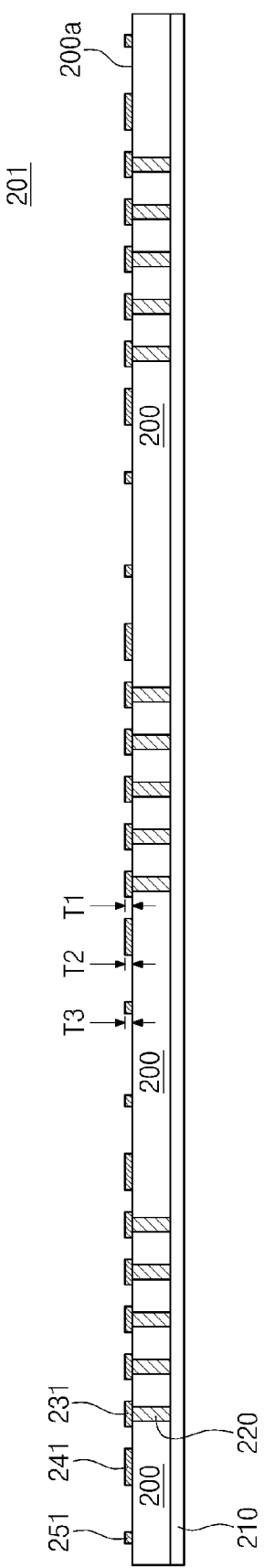
FIG. 6A
FIG. 6B

US 9,875,992 B2

SEMICONDUCTOR PACKAGE HAVING STACKED CHIPS AND A HEAT DISSIPATION PART AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2014-0120307, filed on Sep. 11, 2014, in the Korean Intellectual Property Office, the disclosure of which is hereby incorporated by reference in its entirety.

BACKGROUND

Embodiments relate to semiconductors. More particularly, embodiments relate to a multi-chip semiconductor package having a through-via and a method of fabricating the same.

Light, small, fast, high-performance and low-cost electronic products may be developed. An integrated circuit chip may be encapsulated by one of various packaging techniques to be formed into a semiconductor package suitable for being used in an electronic product. Various research has been conducted for improving performance of semiconductor packages. In particular, a through-silicon-via (TSV) technique has been developed to improve the performance of the semiconductor packages in substitute for a conventional wire bonding technique.

SUMMARY

An embodiment includes a semiconductor package comprising: a substrate; a first semiconductor chip mounted on the substrate; a second semiconductor chip mounted on a top surface of the first semiconductor chip; a connecting bump disposed between the first and second semiconductor chips to electrically connect the second semiconductor chip to the first semiconductor chip; and a first heat dissipation part disposed on the top surface of the first semiconductor chip between the first and second semiconductor chips and spaced apart from a bottom surface of the second semiconductor chip.

An embodiment includes a semiconductor package comprising: a substrate; a first semiconductor chip disposed on the substrate; a second semiconductor chip disposed on the first semiconductor chip; a connecting bump disposed between the first and second semiconductor chips to electrically connect the second semiconductor chip to the first semiconductor chip, a first pad disposed between the first semiconductor chip and the connecting bump; and a heat dissipation part disposed on the top surface of the first semiconductor chip between the first and second semiconductor chips and spaced apart from a bottom surface of the second semiconductor chip, wherein the first heat dissipation part includes a second pad.

An embodiment includes a method of fabricating a semiconductor package, the method comprising: preparing a first semiconductor chip including a patterned conductive layer disposed on a top surface of the first semiconductor chip; mounting the first semiconductor chip on a substrate; mounting a second semiconductor chip on the top surface of the first semiconductor chip, the second semiconductor chip electrically connected to the first semiconductor chip through a connecting bump; and forming a heat dissipation part disposed on the top surface of the first semiconductor chip and spaced apart from a bottom surface of the second semiconductor chip.

BRIEF DESCRIPTION OF THE DRAWINGS

Embodiments will become more apparent in view of the attached drawings and accompanying detailed description.

FIG. 1A is a plan view illustrating a semiconductor package according to an embodiment;

FIGS. 6A, 6B, and 6D to 6I are cross-sectional views illustrating a method of fabricating a semiconductor package according to various embodiments;

DETAILED DESCRIPTION OF THE EMBODIMENTS

Figure 1B:
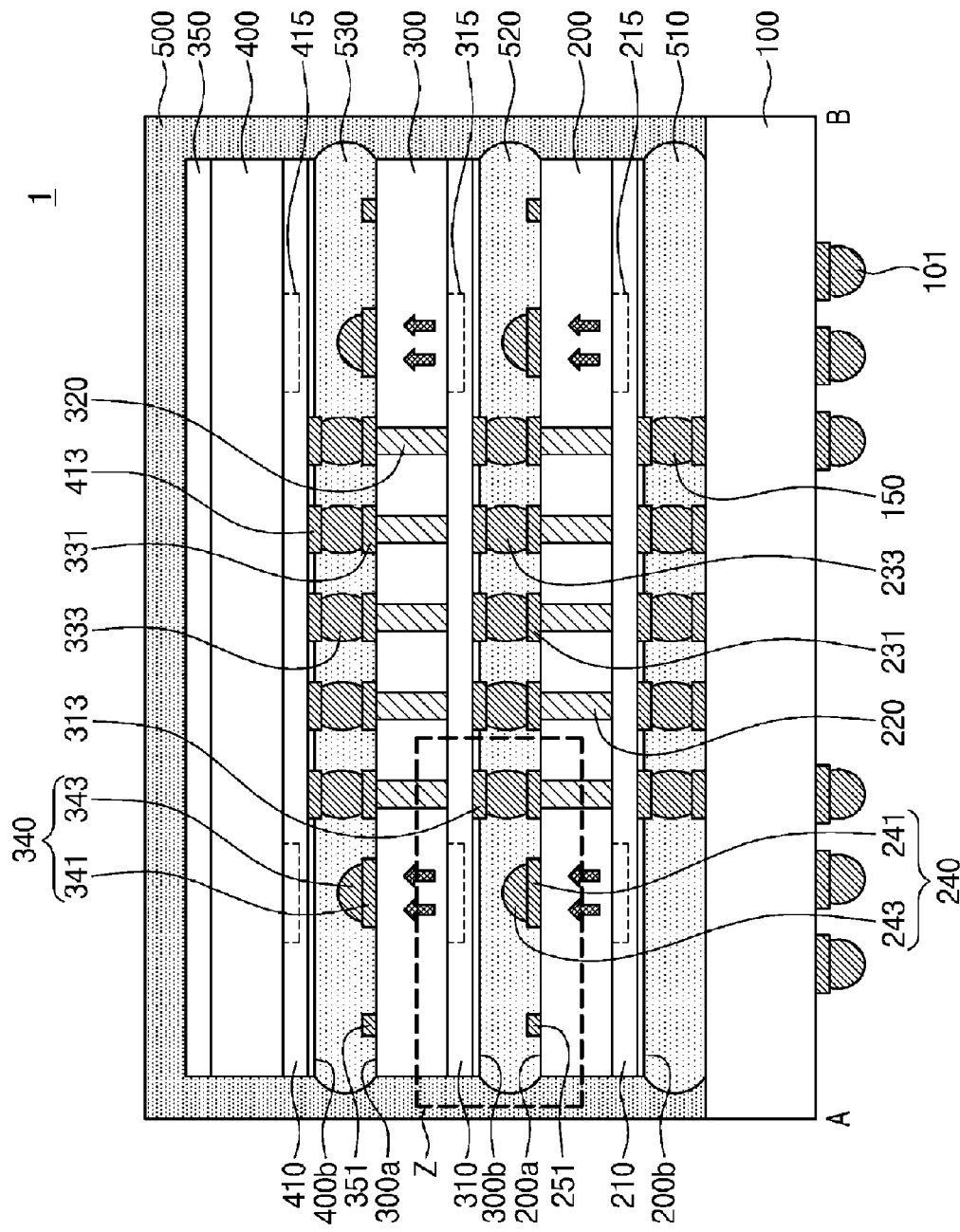
FIG. 1B is a cross-sectional view taken along a line A-B of FIG. 1A.

Embodiments will now be described more fully hereinafter with reference to the accompanying drawings, in which particular embodiments are shown. The advantages and features and methods of achieving them will be apparent from the following embodiments that will be described in more detail with reference to the accompanying drawings. It should be noted, however, that embodiments are not limited to the following particular embodiments, and may be implemented in various forms. Accordingly, these embodiments are provided only to disclose the concepts those skilled in the art. In the drawings, embodiments are not limited to the specific examples provided herein and may be exaggerated for clarity.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein one or more devices according to various embodiments described herein may be integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for multiple devices according to various embodiments described herein that extend along two different directions in a plan view and/or in three different directions in a perspective view. For example, when a single active region is illustrated in a cross-sectional view of a device/structure, the device/structure may include multiple active regions and transistor structures (or memory cell structures, gate structures, etc., as appropriate to the case) thereon, as would be illustrated by a plan view of the device/structure.

Figure 1C:
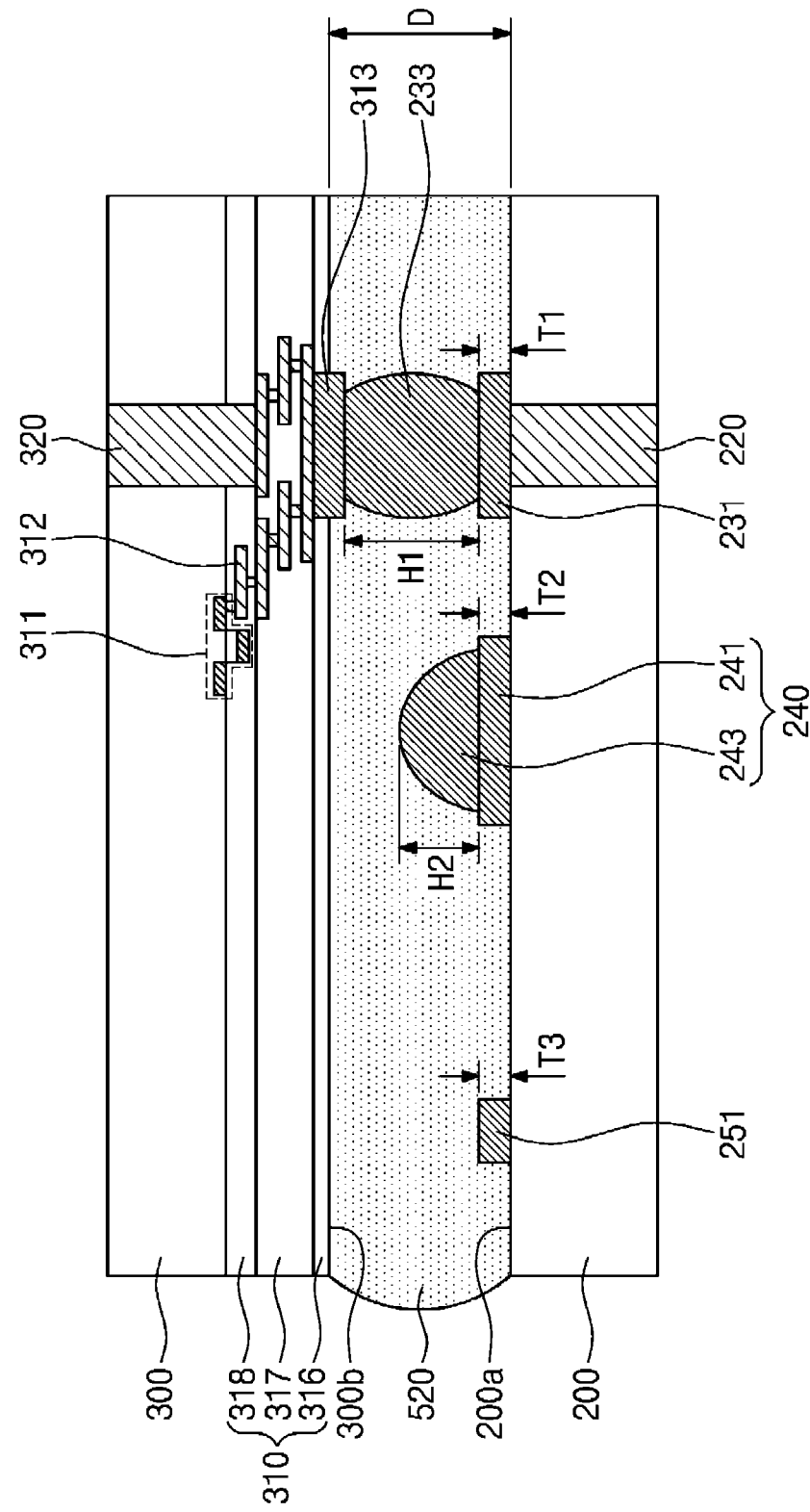
FIG. 1C is an enlarged view of a region 'Z' of FIG. 1B.

FIG. 1A is a plan view illustrating a semiconductor package according to an embodiment. FIG. 1B is a cross-sectional view taken along a line A-B of FIG. 1A. FIG. 1C is an enlarged view of a region 'Z' of FIG. 1B. Referring to FIGS. 1A and 1B, a semiconductor package 1 may include a substrate 100 and multiple semiconductor chips 200, 300, and 400. The substrate 100 may be a printed circuit board (PCB) including circuit patterns or other substrate on which semiconductor chips may be mounted. In other embodiments, the substrate 100 may include a semiconductor chip. External terminals 101 may be disposed on a bottom surface of the substrate 100. The external terminals 101 may include a conductive material and may have a solder ball shape. The substrate 100 may be electrically connected to an external device (not shown) through the external terminals 101.

A first semiconductor chip 200 may be mounted on the substrate 100 by a flip-chip mounting technique. The first semiconductor chip 200 may be electrically connected to the substrate 100 through interconnecting parts 150. The interconnecting parts 150 may be disposed between the substrate 100 and the first semiconductor chip 200. The first semiconductor chip 200 may include a silicon material or other material on which a semiconductor device may be formed. A first insulating pattern 510 may be provided between the substrate 100 and the first semiconductor chip 200 and may fill a space between the interconnecting parts 150. The first insulating pattern 510 may include an insulating polymer.

The first semiconductor chip 200 may include a first circuit pattern layer 210 and a first through-via 220. The first circuit pattern layer 210 may be disposed to be adjacent to a bottom surface 200b of the first semiconductor chip 200 and may be electrically connected to the interconnecting parts 150. The first circuit pattern layer 210 may include integrated circuits, such as memory circuits, logic circuits, or a combination thereof; however, the first circuit pattern layer 210 is not limited to such circuits. The bottom surface 200b of the first semiconductor chip 200 may act as an active surface, and a top surface 200a of the first semiconductor chip 200 may act as a non-active surface. The first through-via 220 may penetrate the first semiconductor chip 200 and may be electrically connected to the first circuit pattern layer 210. In some embodiments, multiple first through-vias 220 may be present in the first semiconductor chip 200.

A second semiconductor chip 300 may be mounted on the top surface 200a of the first semiconductor chip 200. For example, the second semiconductor chip 300 may be electrically connected to the first semiconductor chip 200 through a first connecting pad 231 and a first connecting bump 233. The first connecting bump 233 may include a conductive material (e.g., a metal). A second insulating pattern 520 may be provided between the first semiconductor chip 200 and the second semiconductor chip 300.

The second semiconductor chip 300 may include a second circuit pattern layer 310 and a second through-via 320. The second circuit pattern layer 310 may be disposed to be adjacent to a bottom surface 300b of the second semiconductor chip 310. A first conductive pad 313 may be disposed on the bottom surface 300b of the second semiconductor chip 300. The first conductive pad 313 may be connected to the first connecting bump 233. In some embodiments, the second semiconductor chip 300 may include a silicon material or other material on which a semiconductor device may be formed.

The first connecting pad 231 may be disposed on the top surface 200a of the first semiconductor chip 200 and may be electrically connected to the first through-via 220. The first connecting pad 231 may include at least one of various metal or conductive materials such as copper, aluminum, nickel, or the like.

A first alignment key 251 may be disposed on the top surface 200a of the first semiconductor chip 200. In some embodiments, the first alignment key 251 may be disposed to be adjacent to a corner of the top surface 200a of the first semiconductor chip 200, as illustrated in FIG. 1A. The first alignment key 251 may be laterally spaced apart from the first connecting pad 231. The first alignment key 251 may include the same or similar material as the first connecting pad 231. For example, the first alignment key 251 may include at least one of metal or conductive materials such as copper, aluminum, nickel, or the like. A shape and a position of the first alignment key 251 may be different from the particular shape and position illustrated.

A first heat dissipation part 240 may be disposed on the top surface 200a of the first semiconductor chip 200. The first heat dissipation part 240 may be spaced apart from the bottom surface of the second semiconductor chip 300. The first heat dissipation part 240 may include a first thermal pad 241 and a first thermal pad 243. The first heat dissipation part 240 may be laterally spaced apart from the first connecting pad 231 and the first alignment key 251. The first thermal pad 241 may include the same material as the first connecting pad 231. For example, the first thermal pad 241 may include at least one of metal or thermally conductive materials such as copper, aluminum, nickel, or the like. The first heat dissipation part 240 may be disposed to not vertically overlap with the first conductive pad 313.

The first semiconductor chip 200 may include a first heat source 215 that is provided in the first circuit pattern layer 210. When the first semiconductor chip 200 is operated, heat generated from the first heat source 215 may be transferred toward the top surface 200a of the first semiconductor chip 200. The first heat source 215 may include a first integrated circuit. The first heat source 215 may include an intellectual property (IP) block such as a central processing unit (CPU), a memory interface unit, a universal serial bus (USB), or the like. The IP block may include a hardware block, a software block, or a combination of such blocks configured to perform a function of a semiconductor integrated circuit. In some embodiments, the first heat source 215 may be disposed in or adjacent to an edge region of the first semiconductor chip 200, as illustrated in FIG. 1A. However, the planar position of the first heat source 215 is not limited to that illustrated. In other embodiments, the planar position of the first heat source 215 may be different according to circuit composition of the first semiconductor chip 200.

The first heat dissipation part 240 may include a material (e.g., a metal) of which a coefficient of thermal expansion (CTE) is greater than that of the first semiconductor chip 200. The heat generated from the first heat source 215 may be rapidly and easily transferred to the first heat dissipation part 240 through the first semiconductor chip 200 so heat may be more uniformly distributed in the first semiconductor chip 200. If heat is concentrated in the first heat source 215 in the first semiconductor chip 200, reliability of the integrated circuits of the first semiconductor chip 200 may deteriorate. However, since the semiconductor package 1 includes the first heat dissipation part 240, the reliability of the semiconductor package 1 may be improved.

Referring still to FIGS. 1A and 1B, the first heat dissipation part 240 may overlap with the first heat source 215 when viewed from a plan view. In other embodiments, the first heat dissipation part 240 may be disposed to be adjacent to the first heat source 215. Thus, the heat generated from the first heat source 215 may be more rapidly transmitted through the second semiconductor chip 300.

Referring to FIG. 1C, the second circuit pattern layer 310 may include a passivation layer 316, first and second interlayer insulating layers 317 and 318, a second integrated circuit 311, and interconnections 312. The passivation layer 316 may be disposed on the bottom surface 300b of the second semiconductor chip 300 and may expose the first conductive pad 313. The passivation layer 316 may include an insulating material. Each of the first and second interlayer insulating layers 317 and 318 may include at least one of a silicon oxide layer, a silicon nitride layer, a silicon oxynitride layer, a low-k dielectric layer, or the like. The second integrated circuit 311 may include a logic circuit, a memory circuit, a combination thereof, or other types or combinations of circuits. The first conductive pad 313 may be disposed on the bottom surface 300b of the second semiconductor chip 300 and may be in contact with the first connecting bump 233. The first conductive pad 313 may be electrically connected to the second integrated circuit 311 and the second through-via 320 through the interconnections 312. The interconnections 312 may include multiple conductive layers and multiple contact plugs. In other embodiments, the first conductive pad 313 may be electrically connected to the second integrated circuit 311 and the second through-via 320 by one or more other various methods.

Other embodiments of the first heat dissipation part will be described with reference to FIGS. 2A and 2B. Hereinafter, the descriptions to the same elements as described above will be omitted or mentioned briefly for the purpose of ease and convenience in explanation.

Figure 2A:
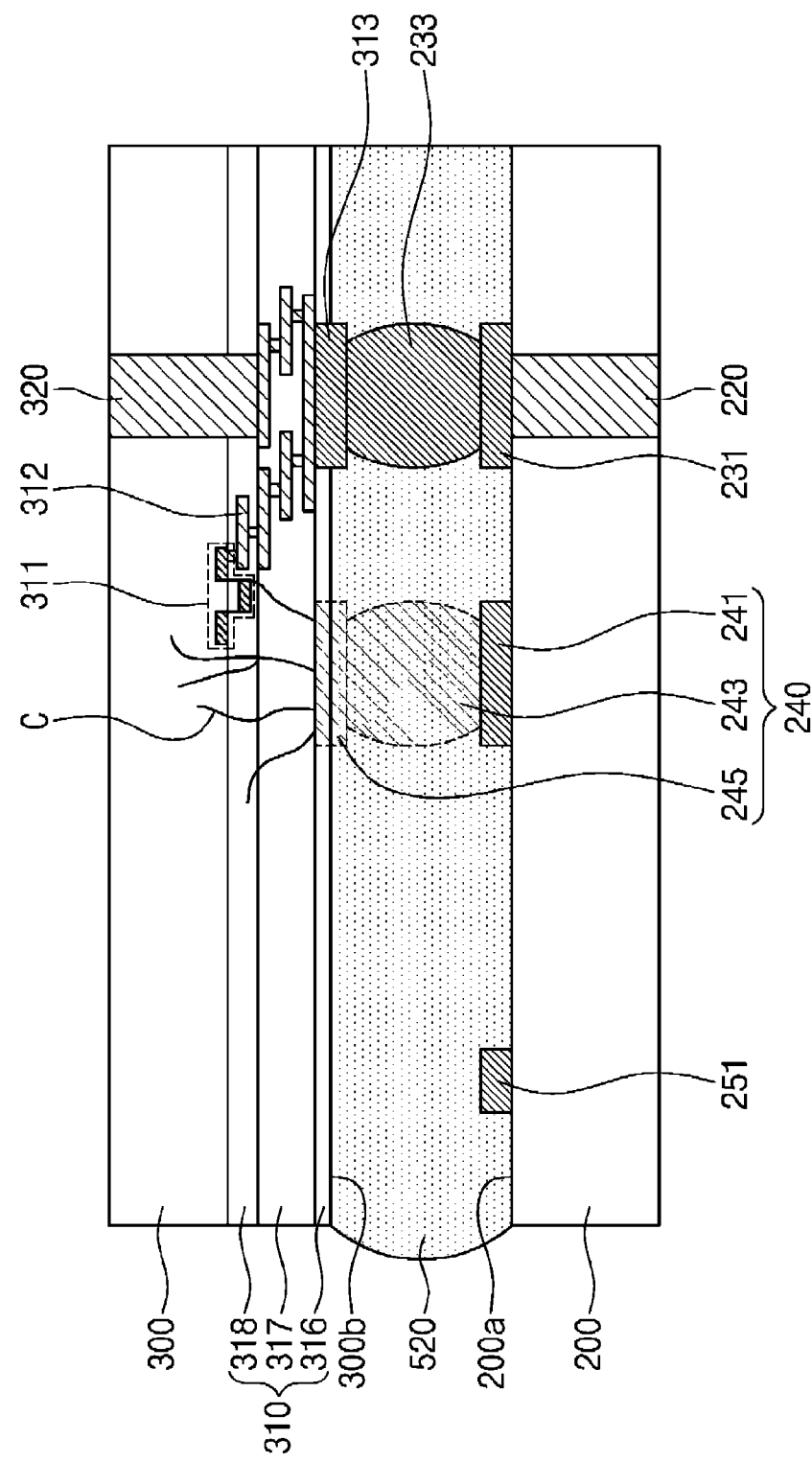
FIG. 2A is an enlarged cross-sectional view illustrating an example of a first heat dissipation part according to an embodiment.

Referring to FIGS. 2A and 1B, a first heat dissipation part 240 may include a first thermal pad 241, a first thermal bump 243, and an upper thermal pad 245. The upper thermal pad 245 may be disposed on the bottom surface 300b of the second semiconductor chip 300. When the first semiconductor chip 200 is operated, the heat generated from the first heat source 215 may be transferred to the first heat dissipation part 240 through the first semiconductor chip 200. The first heat dissipation part 240 may include a material having a CTE is different from that of the second semiconductor chip 300. For example, the second semiconductor chip 300 may include a silicon material, and the first heat dissipation part 240 may include a metal material. A volume of the first heat dissipation part 240 may be varied according to the heat expected to be transmitted from the first heat source 215. As the first semiconductor chip 200 is repeatedly operated, the first heat dissipation part 240 may be repeatedly shrunken and expanded. A variation rate of the volume of the first semiconductor chip 200 may be greater than that of a volume of the second semiconductor chip 300. A crack C may be formed adjacent to the first heat dissipation part 240 at the bottom surface 300b of the second semiconductor chip 300 due to a difference between the CTEs of the first heat dissipation part 240 and the second semiconductor chip 300. The second integrated circuit 311 and/or the interconnection 312 adjacent to the first heat dissipation part 240 may be damaged by the crack C.

Figure 2B:
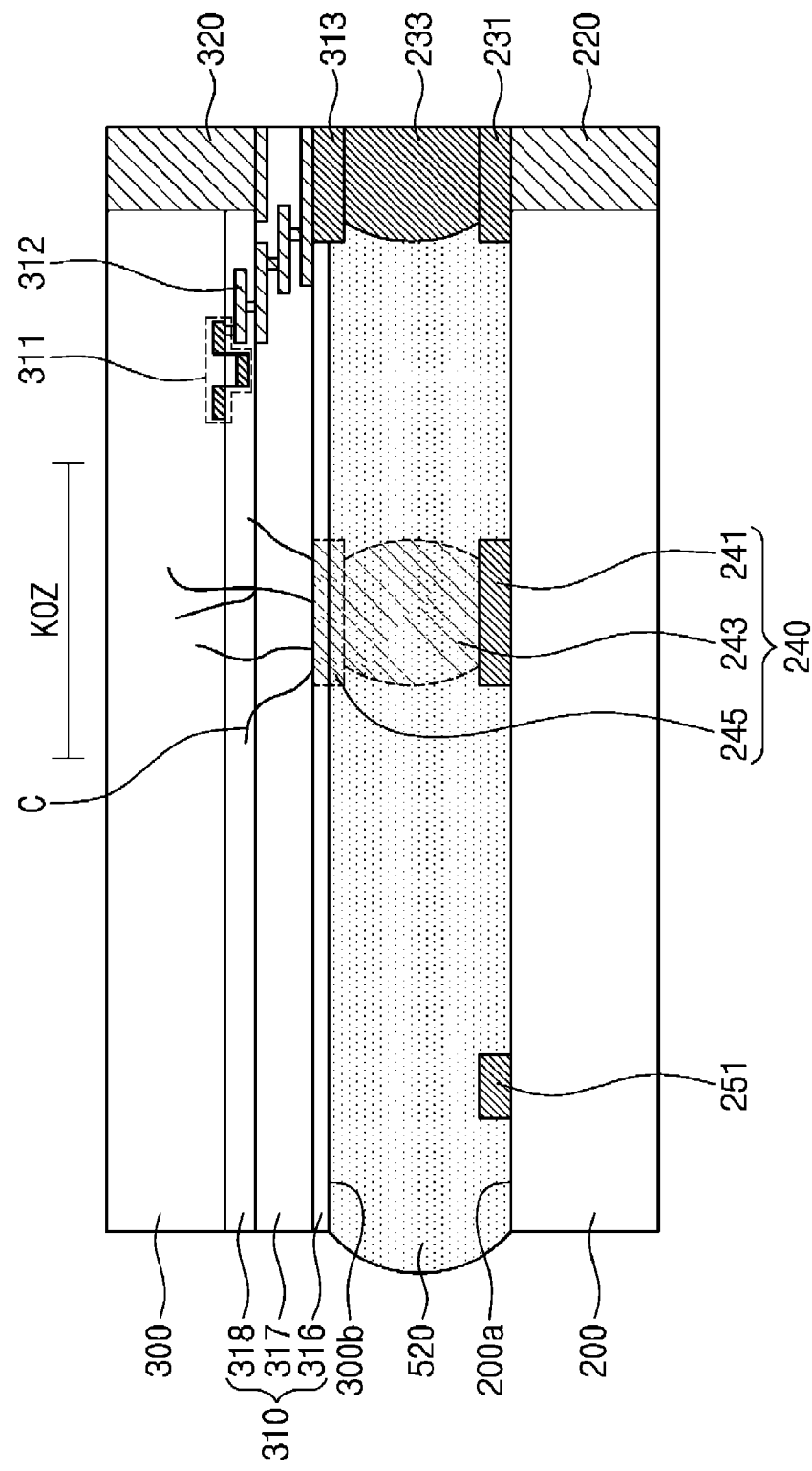
FIG. 2B is an enlarged cross-sectional view illustrating another example of a first heat dissipation part according to an embodiment.

Referring to FIG. 2B, the second integrated circuit 311 may be spaced apart from a keep out zone KOZ defined by the first heat dissipation part 240. The keep out zone KOZ may be a region in which the crack C may occur due to the CTE difference between the first heat dissipation part 240 and the second semiconductor chip 300. The keep out zone KOZ may be adjacent to the bottom surface 300b of the second semiconductor chip 300. As a result, even though the crack C occurs, the second integrated circuit 311 may not be damaged. However, the position of the second integrated circuit 311 may be limited by the position of the first heat dissipation part 240, so the degree of freedom of the position of the second integrated circuit 311 may be reduced.

Referring again to FIG. 1C, the first heat dissipation part 240 may be spaced apart from the bottom surface 300b of the second semiconductor chip 300. For example, a height H2 of the first thermal bump 243 may be lower or smaller than a height H1 of the first connecting bump 233. A distance D between the top surface 200a of the first semiconductor chip 200 and the bottom surface 300b of the second semiconductor chip 300 may be greater than a height of the first heat dissipation part 240, e.g., a sum of a thickness T2 of the first thermal pad 241 and the height H2 of the second thermal bump 243. The first heat dissipation part 240 may be spaced apart from the bottom surface 300b of the second semiconductor chip 300, so the second insulating pattern 520 may be provided between the first heat dissipation part 240 and the second semiconductor chip 300. The heat generated from the first heat source 215 of the first semiconductor chip 200 may not be transferred to the second semiconductor chip 300, and thus, the crack C of FIGS. 2A and 2B may not be formed in the second semiconductor chip 300. The keep out zone KOZ may not be defined at the bottom surface 300b of the second semiconductor chip 300. According to some embodiments, the second integrated circuit 311 of the second semiconductor chip 300 may not be damaged by the first heat dissipation part 240. In addition, the position of the second integrated circuit 311 may not be limited by the position of the first heat dissipation part 240. The second integrated circuit 311 may be adjacent to the first heat dissipation part 240. For example, the second integrated circuit 311 may overlap with the first heat dissipation part 240 when viewed from a plan view. Thus, the position of the second integrated circuit 311 may be variously modified.

The thickness T2 of the first thermal pad 241 may be substantially equal to a thickness T1 of the first connecting pad 231 and a thickness T3 of the first alignment key 251. Here, a range of the substantial equal thickness may include a tolerance range of a thickness that may be caused when the pads 241 and 231 and the key 251 are formed by the same process.

The first connecting bump 233 may be in contact with the first connecting pad 231 and the first conductive pad 313 which are formed on the top surface 200a of the first semiconductor chip 200 and the bottom surface 300b of the second semiconductor chip 300, respectively. The first connecting bump 233 and the first thermal bump 243 may include a metal material. The material included in the first connecting bump 233 may be the same as or different from the material included in the first thermal bump 243.

Figure 3A:
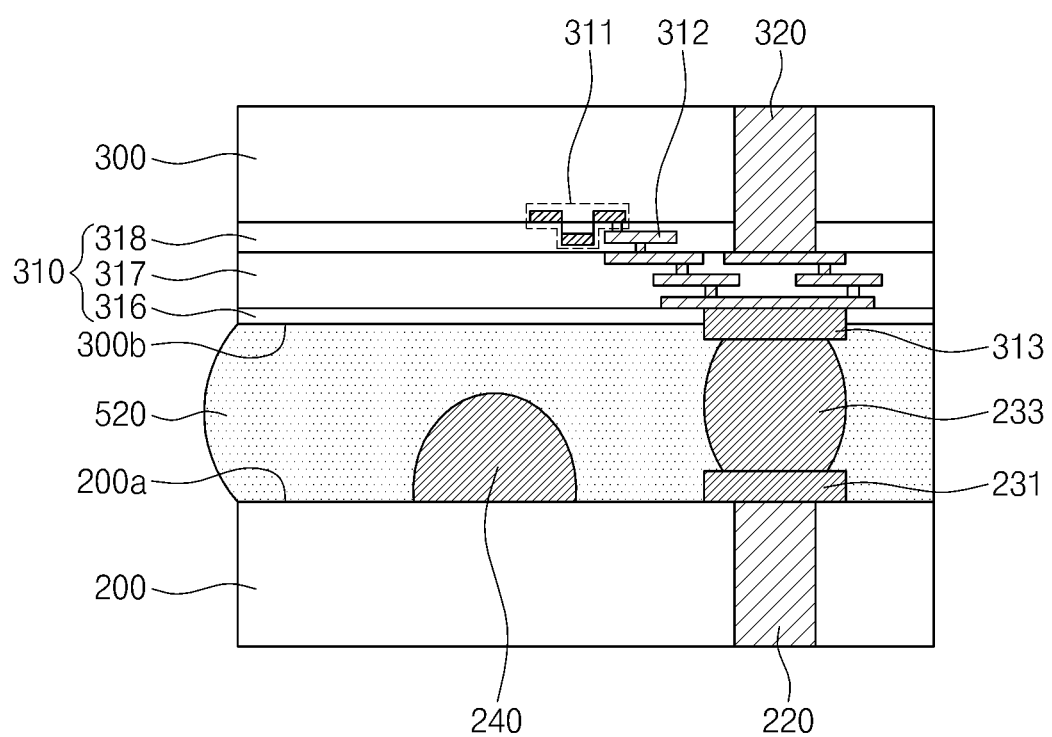
FIG. 3A is a cross-sectional view illustrating a first heat dissipation part according to an embodiment.
Figure 3B:
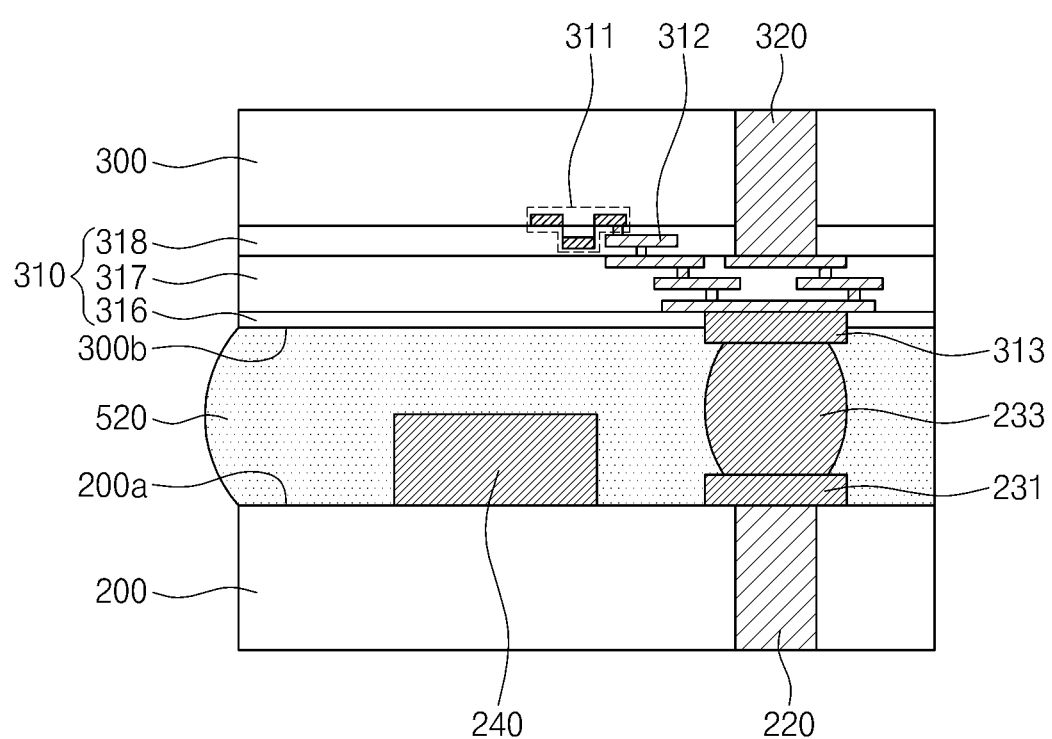
FIG. 3B is a cross-sectional view illustrating a first heat dissipation part according to an embodiment.

FIGS. 3A and 3B are enlarged cross-sectional views illustrating first heat dissipation parts according to other embodiments. Hereinafter, the descriptions to the same elements as described above will be omitted or mentioned briefly for the purpose of ease and convenience in explanation.

Referring to FIGS. 1B, 3A, and 3B, a first heat dissipation part 240 may be laterally spaced apart from the first connecting pad 231 on the top surface 200a of the first semiconductor chip 200. A height of the first heat dissipation part 240 may be lower or smaller than that of the first connecting bump 233, so the first heat dissipation part 240 may be spaced apart from each other. In other words, a top end of the first heat dissipation part 240 may be lower than that of the first connecting bump 233. A cross-section of the first heat dissipation part 240 may have one of various shapes. In some embodiments, as illustrated in FIG. 3A, the first heat dissipation part 240 may include the first thermal bump 243 of FIG. 1B but may not include the first thermal pad 241 of FIG. 1B. The first heat dissipation part 240 may have a rounded cross-section. In other embodiments, the first heat dissipation part 240 may have a rectangular cross-section, as illustrated in FIG. 3B. Although rounded and rectangular cross-sections have been used as examples, the first heat dissipation part 240 may have other shapes. A thickness of the first heat dissipation part 240 may be different from that of the first connecting pad 231.

Figure 4A:
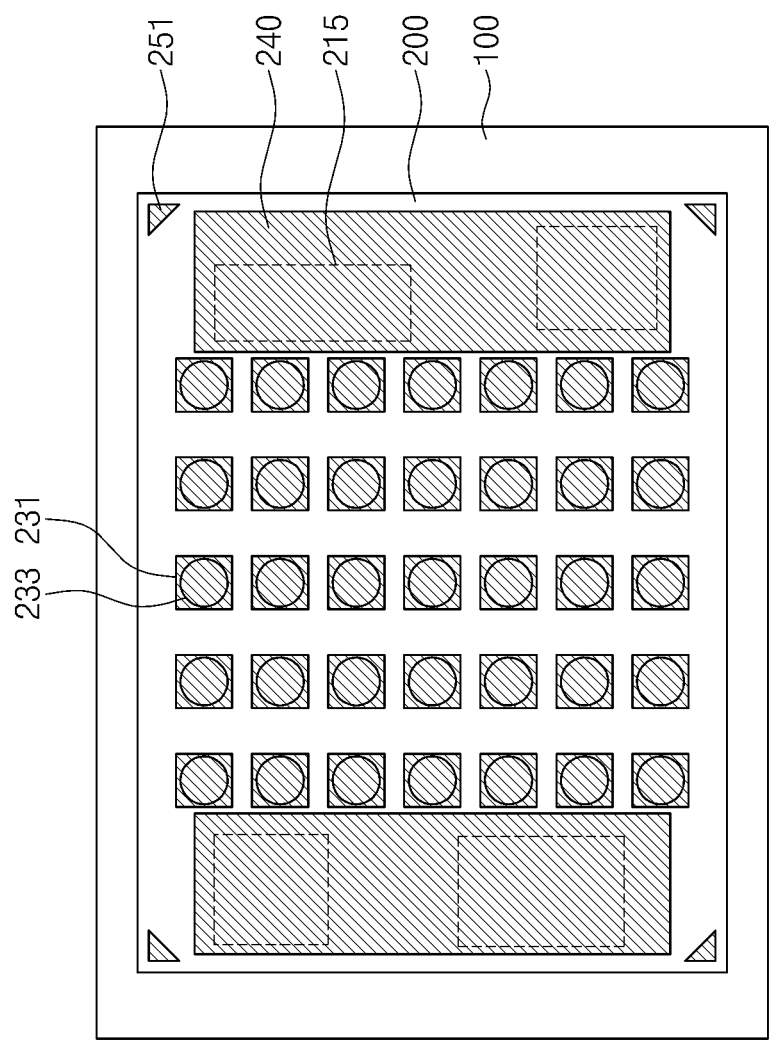
FIG. 4A is a plan view illustrating a first heat dissipation part according to an embodiment.
Figure 4B:
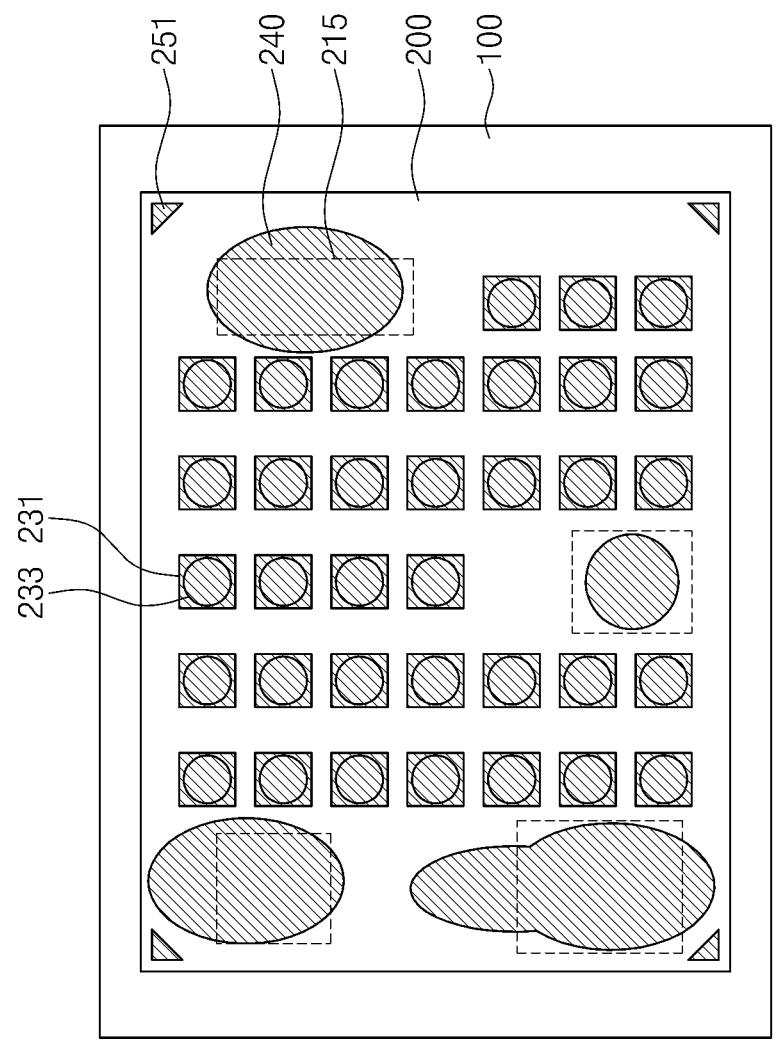
FIG. 4B is a plan view illustrating a first heat dissipation part according to an embodiment.

FIGS. 4A and 4B are plan views illustrating first heat dissipation parts according to still other embodiments. Hereinafter, the descriptions to the same elements as described above will be omitted or mentioned briefly for the purpose of ease and convenience in explanation.

Referring to FIGS. 4A and 4B, a first heat dissipation part 240 may be disposed on the first semiconductor chip 200. The first heat dissipation part 240 may be spaced apart from the first alignment key 251 and the first connecting pad 231. When viewed from a plan view, the first heat dissipation part 240 may overlap with or be adjacent to the first heat source 215. The position of the first heat dissipation part 240 may be changed depending on the position of the first heat source 215. The first heat dissipation part 240 may have one of various shapes. One or more first heat dissipation parts 240 may be provided, each having the same, similar, or different shapes. As illustrated in FIG. 4A, multiple first heat sources 215 may be present in the first semiconductor chip 200. In some embodiments, the first heat dissipation part 240 may overlap with two or more first heat sources 215. A planar area of the first heat dissipation part 240 may be greater than that of the first heat source 215. The first heat dissipation part 240 may have a rectangular shape when viewed from a plan view. Alternatively, the first heat dissipation part 240 may have a rounded shape in a plan view, as illustrated in FIG. 4B. For example, the first heat dissipation part 240 may have a circular shape, an elliptical shape, a combined shape of the circular shape and the elliptical shape, an irregular shape, or the like. If multiple first heat dissipation parts 240 are present, the first heat dissipation parts 240 may have different shapes from each other and different areas from each other. Although a first heat source 215 has been described as being associated with a single first heat dissipation part 240, a first heat source 215 may be associated with multiple first heat dissipation parts 240. The planar position of the first heat source 215 may not be limited to an edge of the first semiconductor chip 200. In other words, the planar position of the first heat source 215 may be variously changed in the first semiconductor chip 200. The first heat dissipation part 240 may overlap with at least a portion of the first heat source 215 of the first semiconductor chip 200 or may be adjacent to the first heat source 215. Thus, the heat generated from the first heat source 215 may be more rapidly transmitted to the first heat dissipation part 240.

Referring again to FIG. 1B, a second connecting pad 331 and a second heat dissipation part 340 may be provided on the top surface 300a of the second semiconductor chip 300. In some embodiments, a second alignment key 351 may also be provided on the top surface 300a of the second semiconductor chip 300. The second heat dissipation part 340 may include a second thermal pad 341 and a second thermal bump 343. The second heat dissipation part 340 may be spaced apart from a bottom surface 400b of a third semiconductor chip 400 mounted on the second semiconductor chip 300. The second thermal pad 341 may include a metal (e.g., copper, aluminum, and/or nickel) or other thermally conductive material. The second thermal bump 343 may similarly include a metal or other thermally conductive material. When the second semiconductor chip 300 is operated, heat generated from a second heat source 315 of the second semiconductor chip 300 may be more rapidly exhausted through the second heat dissipation part 340. Thus, reliability of the second semiconductor chip 300 may be improved. A shape and a position of the second heat dissipation part 340 may be the same as or similar to the shape and the position of the first heat dissipation part 240 described with reference to FIGS. 3A, 3B, 4A, and 4B.

The second connecting pad 331 may be laterally spaced apart from the second heat dissipation part 340. The second connecting pad 331 may be electrically connected to the second through-via 320. The second through-via 320 may penetrate the second semiconductor chip 300 so as to be electrically connected to the second circuit pattern layer 310. The second connecting pad 331 may include the same, similar, or different material as the second thermal pad 341. A thickness of the second connecting pad 331 may be substantially equal to that of the second thermal pad 341.

The third semiconductor chip 400 may be mounted on the top surface 300a of the second semiconductor chip 300. A second connecting bump 333 may be disposed on the second connecting pad 331 and may be in contact with the second connecting pad 331 and a second conductive pad 413. The third semiconductor chip 400 may be electrically connected to the second semiconductor chip 300 through the second connecting bump 333 and the second connecting pad 331. A height of the second connecting bump 333 may be greater than that of the second thermal bump 343. A third insulating pattern 530 may be disposed between the second semiconductor chip 300 and the third semiconductor chip 400 to cover sidewalls of the second connecting bump 333. The second heat dissipation part 340 may be spaced apart from the bottom surface of the third semiconductor chip 400, so the third insulating pattern 530 may be disposed between the second heat dissipation part 340 and the third semiconductor chip 400. The third insulating pattern 530 may include an insulating polymer.

The third semiconductor chip 400 may include a third circuit pattern layer 410 adjacent to a bottom surface 400b thereof. The third circuit pattern layer 410 may include the same kind or a similar kind of an integrated circuit (e.g., the memory circuit) as the second circuit pattern layer 310. However, embodiments are not limited thereto. In other embodiments, the third circuit pattern layer 410 may include at least one of other various kinds of integrated circuits. In still other embodiments, the third semiconductor chip 400 may be omitted. In this case, the second through-via 320 and the second connecting pad 331 may be omitted.

A heat slug 350 may be disposed on the third semiconductor chip 400. The heat slug 350 may include a metal such as copper, aluminum, nickel, or other thermally conductive material. When the third semiconductor chip 400 is operated, heat generated from a third heat source 415 of the third semiconductor chip 400 may be exhausted through the heat slug 350. In other embodiments, the heat slug 350 may be omitted.

Embodiments are not limited to the number of the semiconductor chips. In other embodiments, a fourth semiconductor chip (not shown) may be mounted on the third semiconductor chip 400. In this case, the third semiconductor chip 400 may include a third through-via (not shown) and a third heat dissipation part (not shown). The third through-via may penetrate the third semiconductor chip 400, and the third heat dissipation part may be disposed on a top surface of the third semiconductor chip 400. In this case, the heat slug 350 may be formed on the fourth semiconductor chip.

A molding layer 500 may be disposed on the substrate 100 to cover the third semiconductor chip 400. The molding layer 500 may also cover a sidewall of the first semiconductor chip 200 and a sidewall of the second semiconductor chip 300. In other embodiments, the first, second, and third insulating patterns 510, 520, and 530 may be omitted, and the molding layer 500 may extend to fill a spaced between substrate 100 and the first semiconductor chip 200, a space between the first and second semiconductor chips 200 and 300, and/or a space between the second and third semiconductor chips 300 and 400. In this case, the molding layer 500 may be provided between the first heat dissipation part 240 and the second semiconductor chip 300 and/or between the second heat dissipation part 340 and the third semiconductor chip 400. The molding layer 500 may include a polymer such as an epoxy molding compound.

Figure 5:
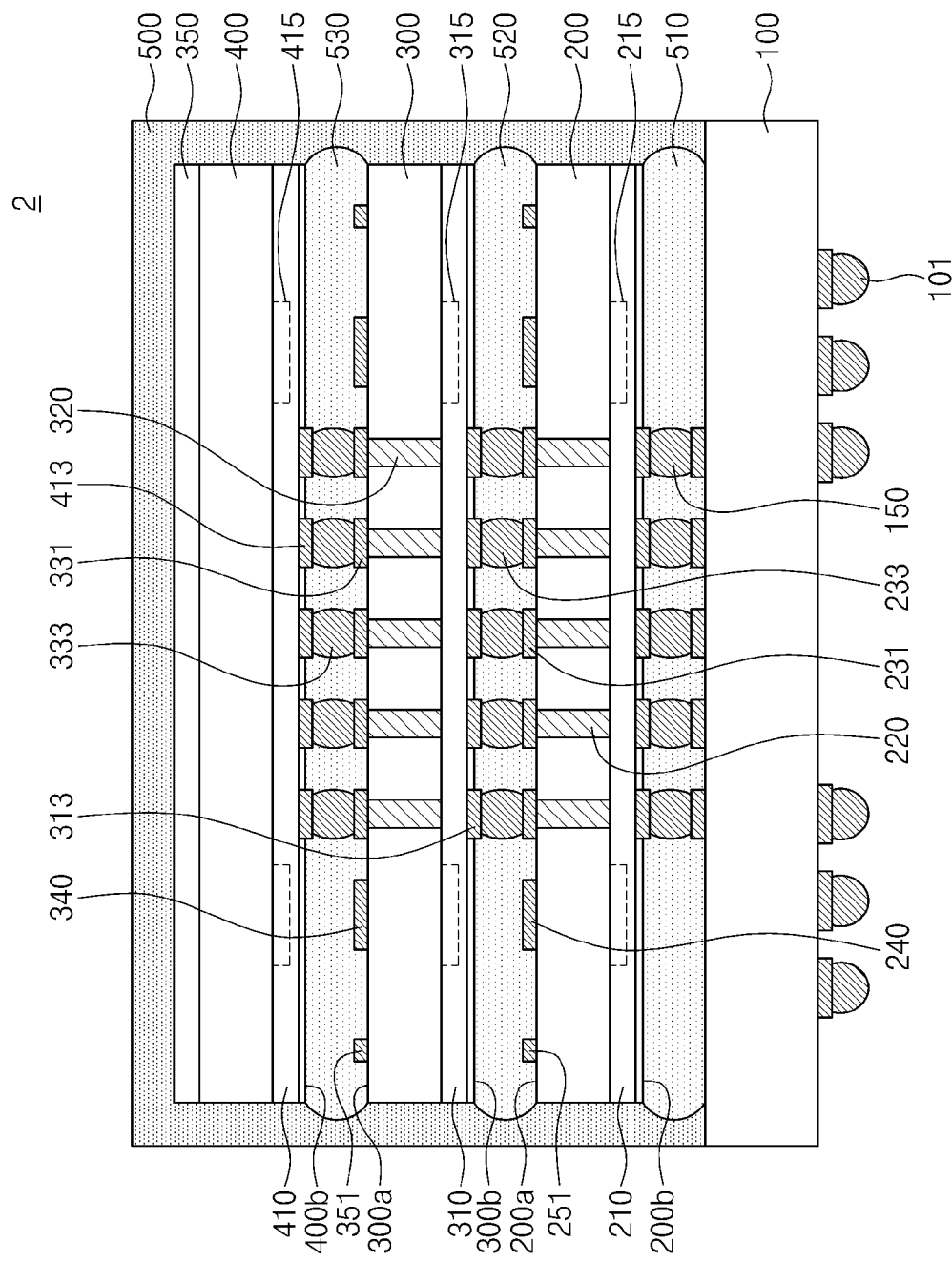
FIG. 5 is a cross-sectional view illustrating a semiconductor package according to an embodiment.

FIG. 5 is a cross-sectional view illustrating a semiconductor package according to an embodiment. Hereinafter, the descriptions to the same elements as described above will be omitted or mentioned briefly for the purpose of ease and convenience in explanation. Referring to FIG. 5, a semiconductor package 2 may include a substrate 100 and multiple semiconductor chips 200, 300, and 400. A first semiconductor chip 200 may be mounted on the substrate 100. The first semiconductor chip 200 may be electrically connected to the substrate 100 through one or more interconnecting parts 150. The first semiconductor chip 200 may include a first circuit pattern layer 210 and a first through-via 220. A first alignment key 251 may be disposed on a top surface 200a of the first semiconductor chip 200. A connecting pad 231 may be disposed on the top surface 200a of the first semiconductor chip 200 and may be electrically connected to the first through-via 220.

A first heat dissipation part 240 may be disposed on the top surface 200a of the first semiconductor chip 200. The first heat dissipation part 240 may be spaced apart from a bottom surface 300b of a second semiconductor chip 300 mounted on the first semiconductor chip 200. The first heat dissipation part 240 may include the first thermal pad 241 described with reference to FIG. 1B. On the other hand, unlike FIG. 1B, the first heat dissipation part 240 in this embodiment may not include the first thermal bump 243 described with reference to FIG. 1B. The first heat dissipation part 240 may be laterally spaced apart from the first connecting pad 231 and the first alignment key 251. The first heat dissipation part 240 may include the same, similar, or different material as the first connecting pad 231 and the first alignment key 251. A thickness of the first heat dissipation part 240 may be substantially equal to a thickness of the first connecting pad 231 and a thickness of the first alignment key 251.

As described with reference to FIGS. 1A, 4A, and 4B, the first heat dissipation part 240 in this embodiment may overlap with the first heat source 215 of the first semiconductor chip 200. When the first semiconductor chip 200 is operated, the heat generated from the first heat source 215 may be more rapidly and easily transferred to the first heat dissipation part 240. Thus, heat may be more uniformly distributed in the first semiconductor chip 200. In other words, reliability of the semiconductor package 2 may be improved. As described with reference to FIGS. 4A and 4B, the shape of the first heat dissipation part 240 in this embodiment may be variously modified and any number of first heat dissipation parts 240 may be included.

As described above, the first heat dissipation 240 part may be spaced apart from the bottom surface of the second semiconductor chip 300, and thus, the heat generated from the first heat source 215 of the first semiconductor chip 200 may not be transferred to the second semiconductor chip 300. This means that the crack C of FIGS. 2A and 2B may not be formed in the second semiconductor chip 300. As a result, the position of the second integrated circuit 311 of the second semiconductor chip 300 may not be limited by the position of the first heat dissipation part 240. For example, as illustrated in FIG. 1C, the second integrated circuit 311 may be vertically spaced apart from the first heat dissipation part 240. In other words, the second integrated circuit 311 may be located in various positions.

The second semiconductor chip 300 may be mounted on the top surface 200a of the first semiconductor chip 200 by means of at least one first connecting bump 233. The first connecting bump 233 may be in contact with the first connecting pad 231 disposed on the top surface 200a of the first semiconductor chip 200. The second insulating pattern 520 may be disposed between the first and second semiconductor chips 200 and 300 and between the first heat dissipation part 240 and the second semiconductor chip 300.

The second semiconductor chip 300 may include a second circuit pattern layer 310 and a second through-via 320. A second connecting pad 331 and a second heat dissipation part 340 may be disposed on a top surface 300a of the second semiconductor chip 300. The second heat dissipation part 340 may include the second thermal pad 341 of FIG. 1B but may not include the second thermal bump 343 of FIG. 1B. The second heat dissipation part 340 may be spaced apart from a bottom surface 400b of a third semiconductor chip 400 mounted on the second semiconductor chip 300. When the second semiconductor chip 300 is operated, heat generated from the second heat source 315 of the second semiconductor chip 300 may be more rapidly exhausted through the second heat dissipation part 340. A shape and a position of the second heat dissipation part 340 may be the same as or similar to those of the first heat dissipation part 240 described with reference to FIGS. 4A and 4B.

The second connecting pad 331 may be laterally spaced apart from the second heat dissipation part 340. The second connecting pad 331 may include the same material as the second heat dissipation part 340. A thickness of the second connecting pad 331 may be substantially equal to a thickness of the second heat dissipation part 340.

The third semiconductor chip 400 may be mounted on the top surface of the second semiconductor chip 300. A second connecting bump 333 may be in contact with a top surface of the second connecting pad 331. A height of the second connecting bump 333 may be greater than a height of the second heat dissipation part 340. The second heat dissipation part 340 may be spaced apart from the bottom surface 400b of the third semiconductor chip 400, so the third insulating pattern 530 may be provided between the second heat dissipation part 340 and the third semiconductor chip 400. A heat slug 350 may be disposed on the third semiconductor chip 400. In other embodiments, the heat slug 350 may be omitted.

A molding layer 500 may be provided on the substrate 100 to cover the third semiconductor chip 400. The molding layer 500 may be the same as described with reference to FIG. 1B.

Next, methods of fabricating the semiconductor package will be described.

FIGS. 6A, 6B, and 6D to 6H are cross-sectional views illustrating a method of fabricating a semiconductor package according to an embodiment. FIG. 6C is a plan view corresponding to FIG. 6B. Hereinafter, the features described above will be omitted or mentioned briefly for the purpose of ease and convenience in explanation.

Referring to FIG. 6A, a semiconductor substrate 201 including a first semiconductor chip 200 may be prepared. Multiple first semiconductor chips 200 may be disposed in the semiconductor substrate 201. The semiconductor substrate 201 may be a wafer-level semiconductor substrate that is formed of a semiconductor (e.g., silicon or other substrate on which semiconductor chips and/or devices may be formed). The first semiconductor chip 200 may include a first circuit pattern layer 210 and at least one first through-via 220. The first circuit pattern layer 210 and the first through-via 220 may be the same as described with reference to FIG. 1B. A conductive layer 260 may be formed on a top surface 200a of the first semiconductor chip 200. The conductive layer 260 may include a metal such as copper, aluminum, nickel, or the like.

Figure 6C:
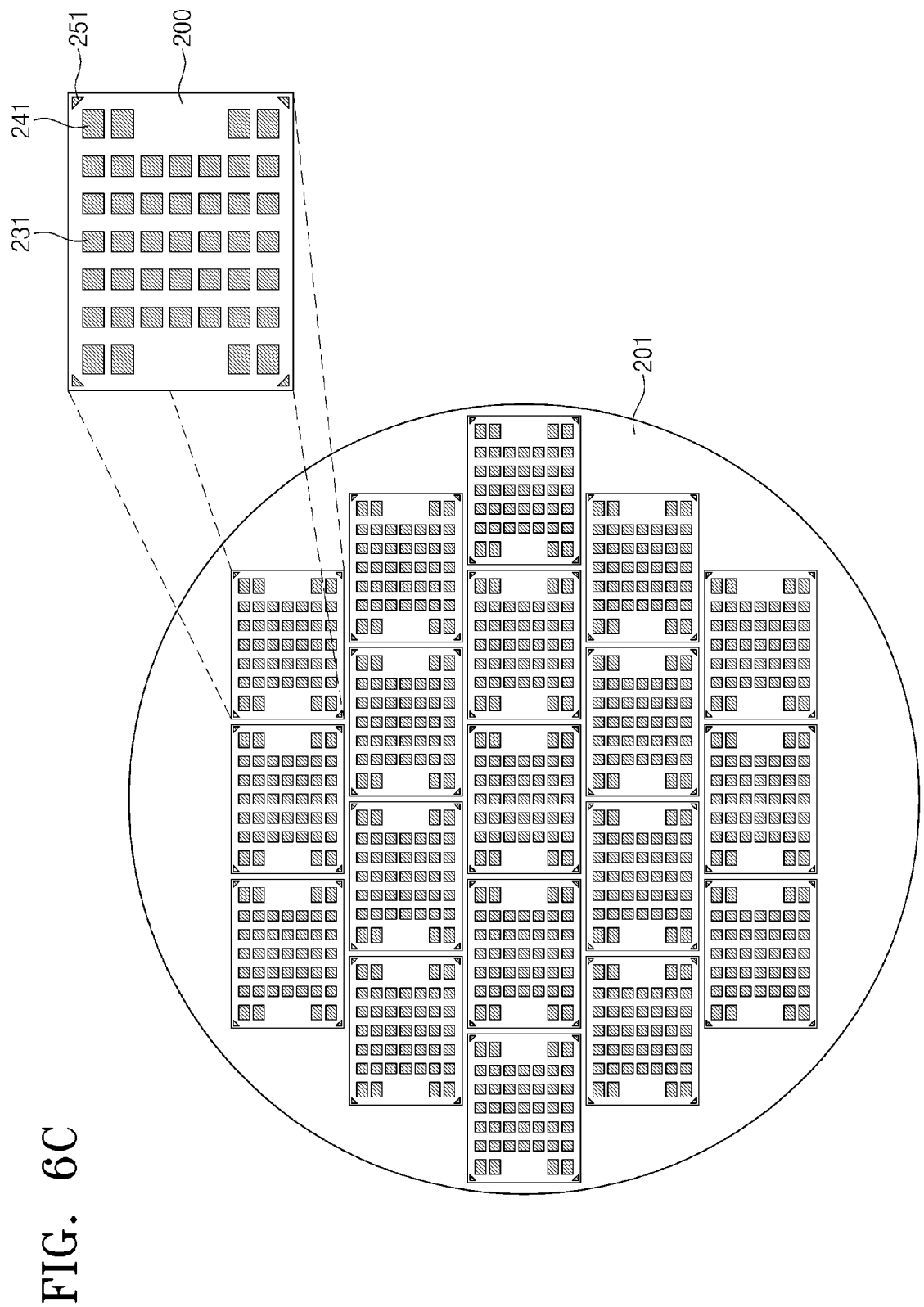
FIG. 6C is a plan view corresponding to FIG. 6B.

Referring to FIGS. 6B and 6C, the conductive layer 260 may be patterned to form a first connecting pad 231, a first thermal pad 241, and a first alignment key 251 on the top surface 200a of the first semiconductor chip 200. For example, the patterning process of the conductive layer 260 may be performed by means of a photolithography process and an etching process; however, other patterning techniques may be used. Since the first thermal pad 241, the first connecting pad 231, and the first alignment key 251 are formed by the same patterning process, the first thermal pad 241 may be more easily and rapidly formed. The first thermal pad 241 may include the same material as the first connecting pad 231 and the first alignment key 251. A thickness T2 of the first thermal pad 241 may be substantially equal to a thickness T1 of the first connecting pad 231 and a thickness T3 of the first alignment key 251. The first connecting pad 231, the first thermal pad 241, and the first alignment key 251 may include the same as or similar structures as those described with reference to FIGS. 1A to 1C.

Figure 6D:
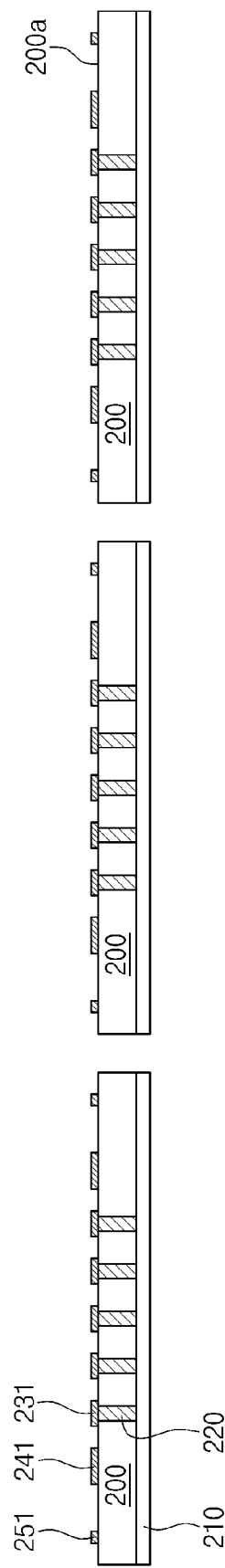

Referring to FIG. 6D, the semiconductor substrate 201 may be sawed to separate the first semiconductor chips 200 from each other. Each of the first semiconductor chips 200 may be the same as described with reference to FIGS. 1A and 1B. However, in some embodiments, each of the semiconductor chips 200 sawed from the substrate 201 may be different semiconductor chips.

Figure 6E:
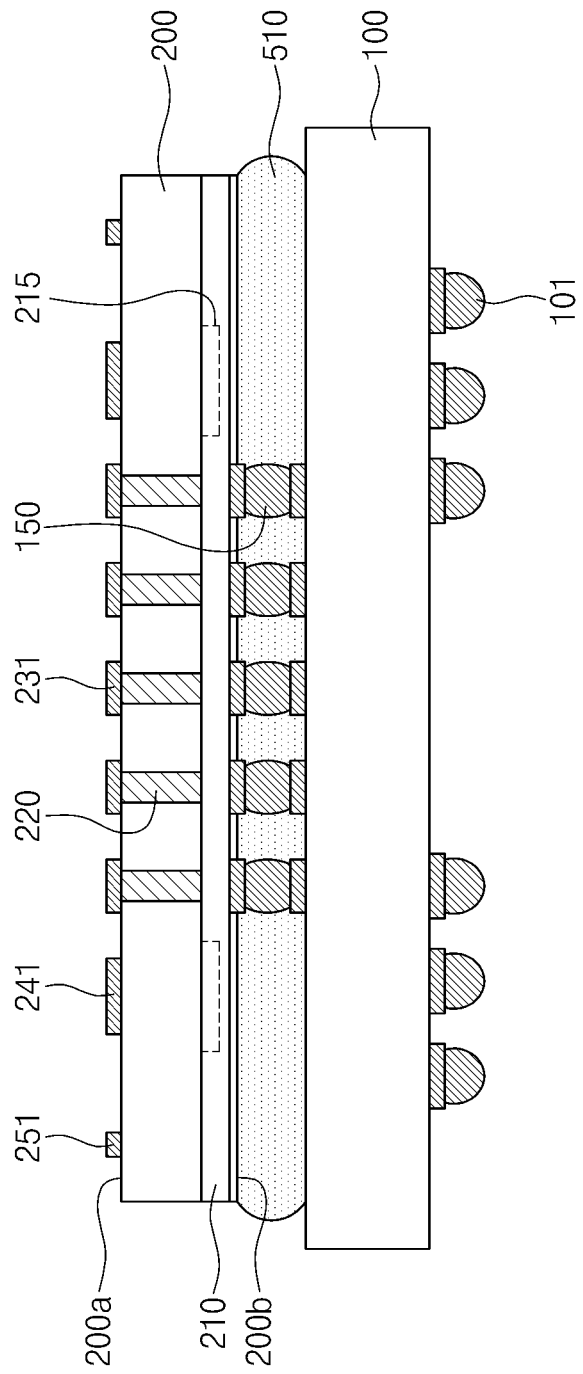

Referring to FIG. 6E, the first semiconductor chip 200 may be mounted on a substrate 100. The substrate 100 may be a printed circuit board (PCB), a semiconductor chip, or other substrate on which semiconductor chips may be mounted. The first semiconductor chip 200 may be fabricated by the method described with reference to FIGS. 6A to 6D. The first semiconductor chip 200 may be aligned with the substrate 100 on the basis of the first alignment key 251 when the first semiconductor chip 200 is mounted on the substrate 100. Interconnecting parts 150 may be formed between the substrate 100 and the first semiconductor chip 200. A first insulating pattern 510 may be formed between the substrate 100 and a bottom surface 200b of the first semiconductor chip 200 to fill a space between the interconnecting parts 150. In other embodiments, the first insulating pattern 510 may not be formed. External terminals 101 may be formed on a bottom surface of the substrate 100.

Figure 6F:
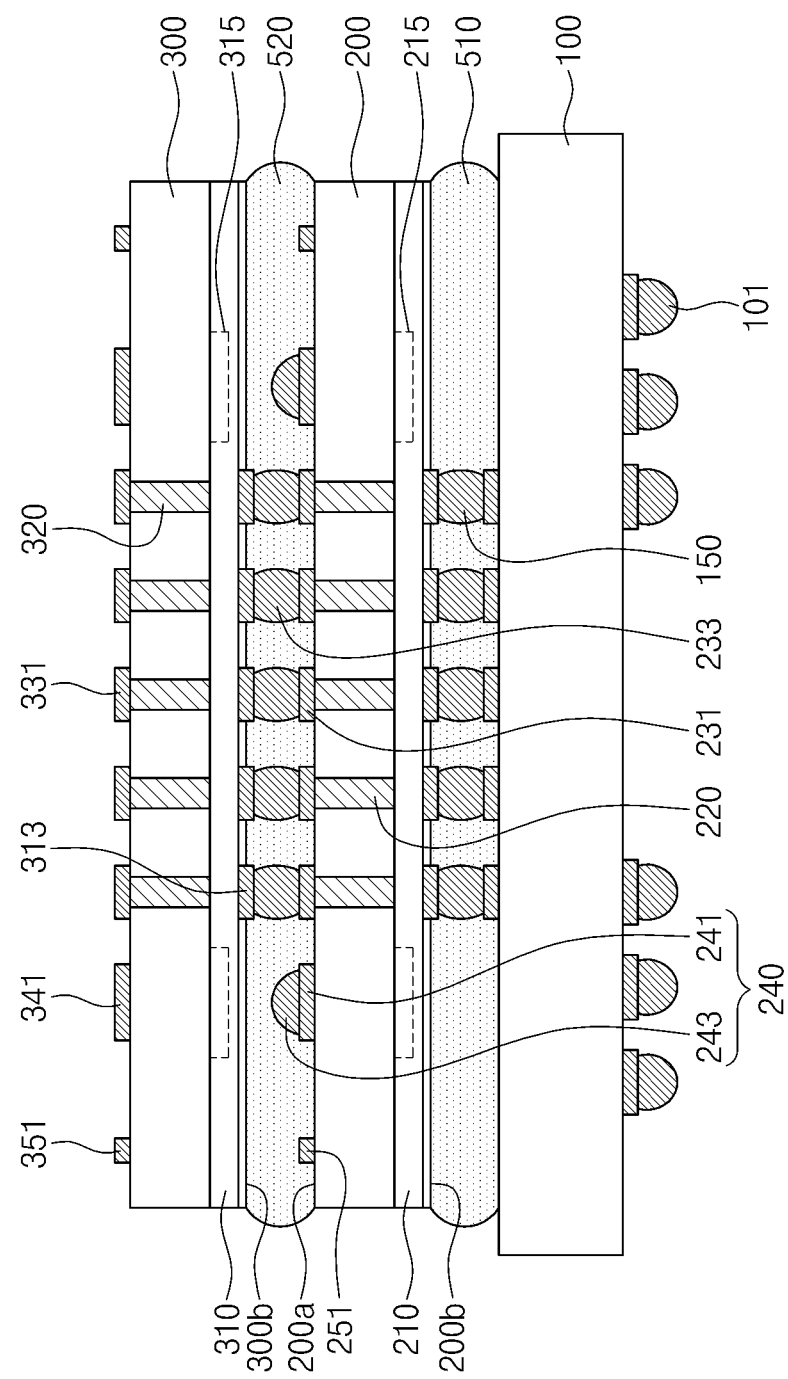

Referring to FIG. 6F, a second semiconductor chip 300 may be mounted on the top surface 200a of the first semiconductor chip 200. The second semiconductor chip 300 may include a second circuit pattern layer 310 and at least one second through-via 320. The second semiconductor chip 300 may be the same or similar as that described with reference to FIG. 1B. The second semiconductor chip 300 may be fabricated by the same method as or a similar method to the fabrication method of the first semiconductor chip 200 described with reference to FIGS. 6A to 6D. For example, a conductive layer may be deposited on a top surface of the second semiconductor chip 300, and the deposited conductive layer may be patterned to form a second connecting pad 331, a second thermal pad 341, and a second alignment key 351 on the top surface of the second semiconductor chip 300. When the second semiconductor chip 300 is mounted on the first semiconductor chip 200, a position of the second semiconductor chip 300 may be controlled on the first semiconductor chip 200 by means of the second alignment key 351.

A first connecting bump 233 may be formed on the first connecting pad 231. The first connecting bump 233 may be in contact with the first connecting pad 231 but may not be in contact with the first thermal pad 241. A first thermal bump 243 may be formed on the first thermal pad 241. A height of the first thermal bump 243 may be smaller than that of the first connecting bump 233. Thus, the first heat dissipation part may be spaced apart from the bottom surface of the second semiconductor chip 300. A process of forming the first thermal bump 243 may be the same as or similar to a process of forming the first connecting bump 233. Since the first heat dissipation part 240 further includes the first thermal bump 243, a volume of the first heat dissipation part 240 may increase. Thus, heat generated from a first heat source 215 may be more rapidly transmitted to the first heat dissipation part 240. A second insulating pattern 520 may be formed between the first and second semiconductor chips 200 and 300 to cover sidewalls of the first connecting bump 233. The second insulating pattern 520 may also be provided between the first heat dissipation part 240 and the second semiconductor chip 300. In other embodiments, the second insulating pattern 520 may be omitted.

Figure 6G:
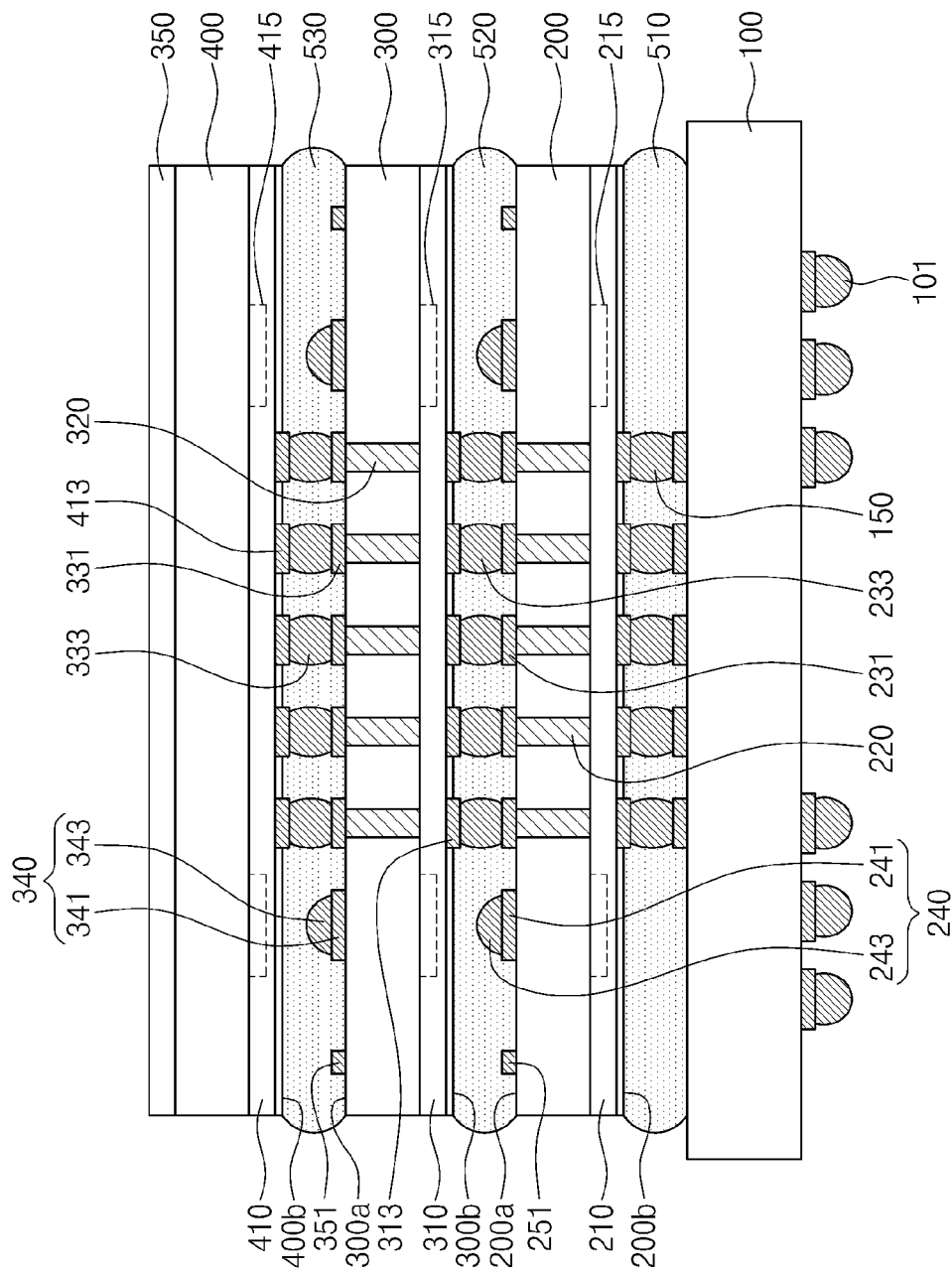

Referring to FIG. 6G, a third semiconductor chip 400 may be mounted on the second semiconductor chip 300. The third semiconductor chip 400 may include a third circuit pattern layer 410 adjacent to a bottom surface 400b of the third semiconductor chip 400. The process of mounting the third semiconductor chip 400 may be the same as or similar to the process of mounting the second semiconductor chip 300. A second connecting bump 333 may be formed on the second connecting pad 331. The second connecting bump 333 may be in contact with the second connecting pad 331 but may not be in contact with the second thermal pad 341. A second thermal bump 343 may be formed on the second thermal pad 341. A height of the second thermal bump 343 may be lower or smaller than that of the second connecting bump 333. Thus, the second heat dissipation part 340 may be spaced apart from a bottom surface 400b of the third semiconductor chip 400. A third insulating pattern 530 may be formed between the second and third semiconductor chips 300 and 400. Since the second heat dissipation part 340 is spaced apart from the bottom surface of the third semiconductor chip 400, the third insulating pattern 530 may also be provided between the second heat dissipation part 340 and the third semiconductor chip 400. In other embodiments, the third insulating pattern 530 may be omitted. A heat slug 350 may be formed on the third semiconductor chip 400.

Figure 6H:
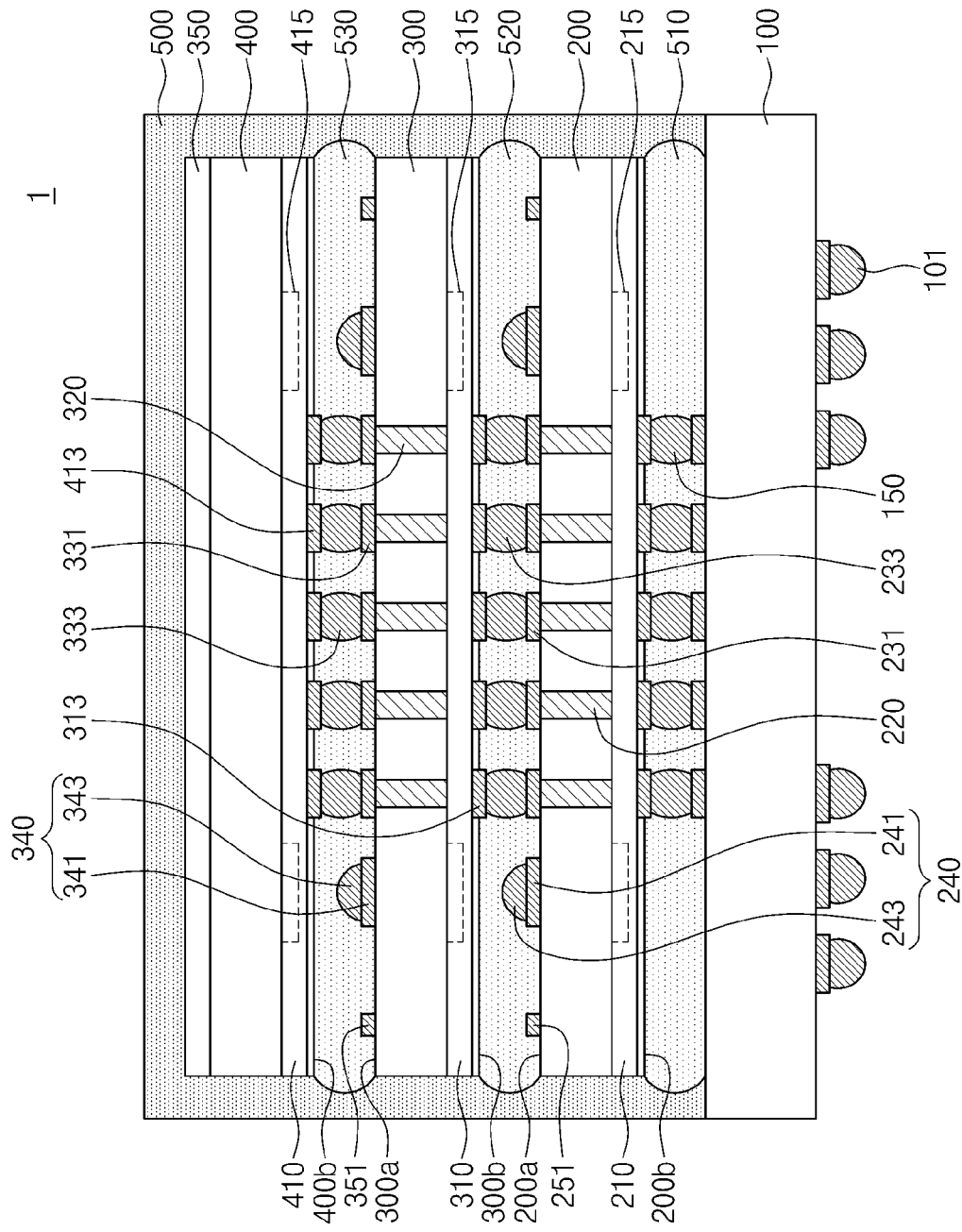

Referring to FIG. 6H, a molding layer 500 may be formed on the substrate 100 to cover the first to third semiconductor chips 200, 300, and 400. In other embodiments, the first, second, and third insulating patterns 510, 520, and 530 may be omitted, and the molding layer 500 may also be formed between the substrate 100 and the first semiconductor chip 200, between the first and second semiconductor chips 200 and 300, and between the second and third semiconductor chips 300 and 400. In this case, the molding layer 500 may be provided between the first heat dissipation part 240 and the second semiconductor chip 300 and between the second dissipation part 340 and the third semiconductor chip 400.

In other embodiments, the first thermal bump 243 of FIG. 6E and the second thermal bump 343 of FIG. 6F may be omitted. In this case, the semiconductor package 2 of FIG. 5 may be fabricated.

Figure 6I:
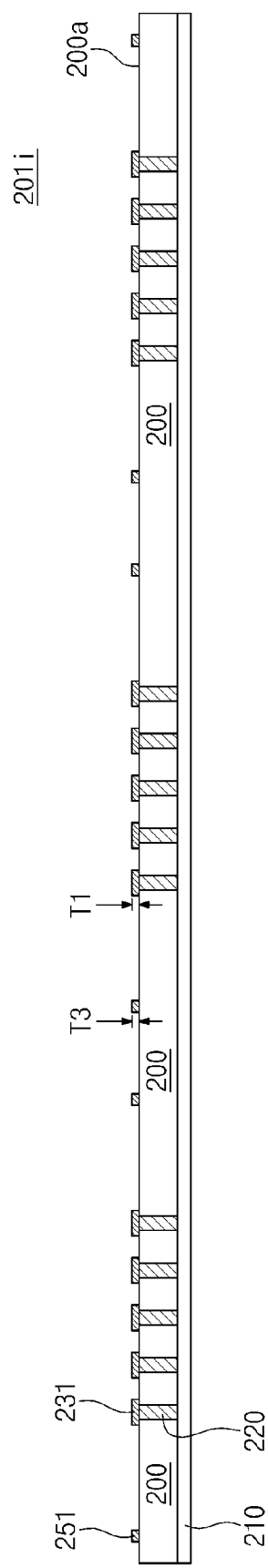

Referring to FIG. 6I, a semiconductor substrate 201i may be prepared similarly to the semiconductor substrate 201 of FIGS. 6A and 6B. However, in this embodiment, the first thermal pad 241 may not be formed. That is, the conductive layer 260 of the semiconductor substrate 201i may be patterned such that the first thermal pad 241 is not formed. The semiconductor substrate 201i may be further processed as the semiconductor substrate 201 described above. However, in FIG. 6F, the first thermal bump 243 may be formed on the top surface 200a of the first semiconductor chip 200 as first heat dissipation part 240 similar to that illustrated in FIG. 3A rather than on the first thermal pad 241.

[Applications]

Figure 7:
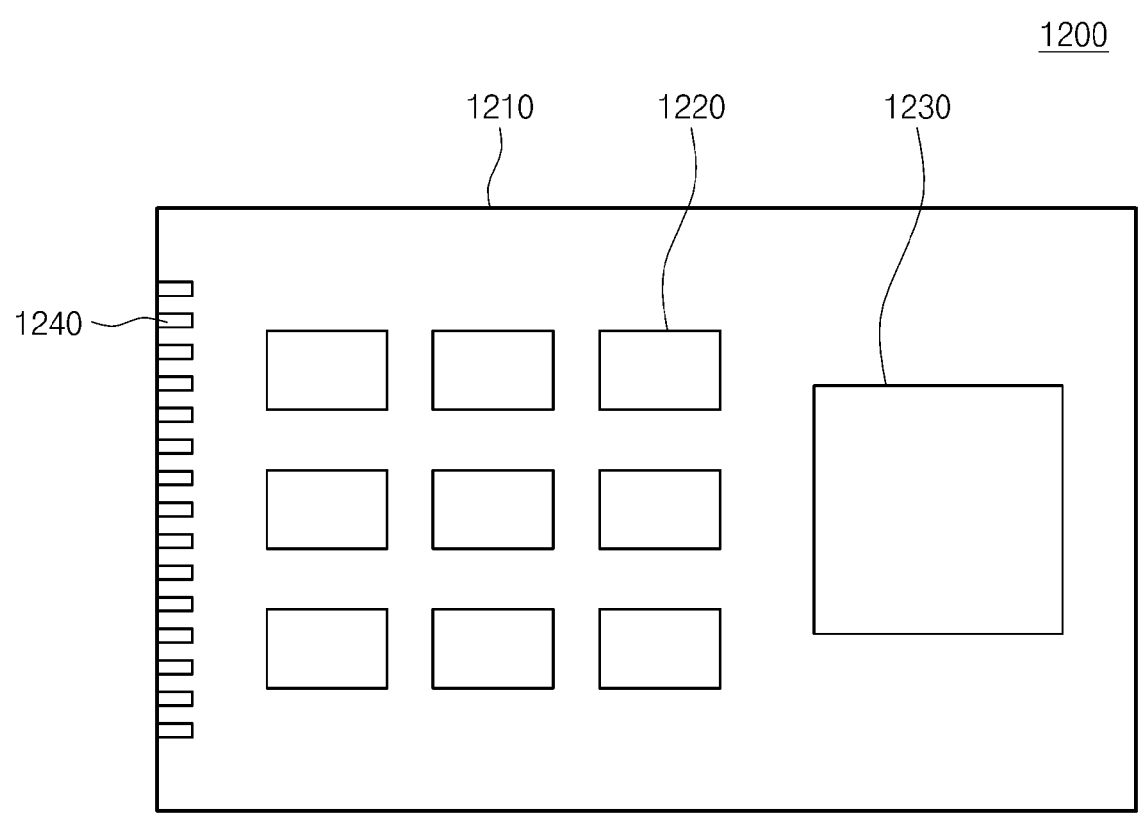
FIG. 7 is a schematic diagram illustrating an example of a package module including a semiconductor package according to some embodiments.
Figure 8:
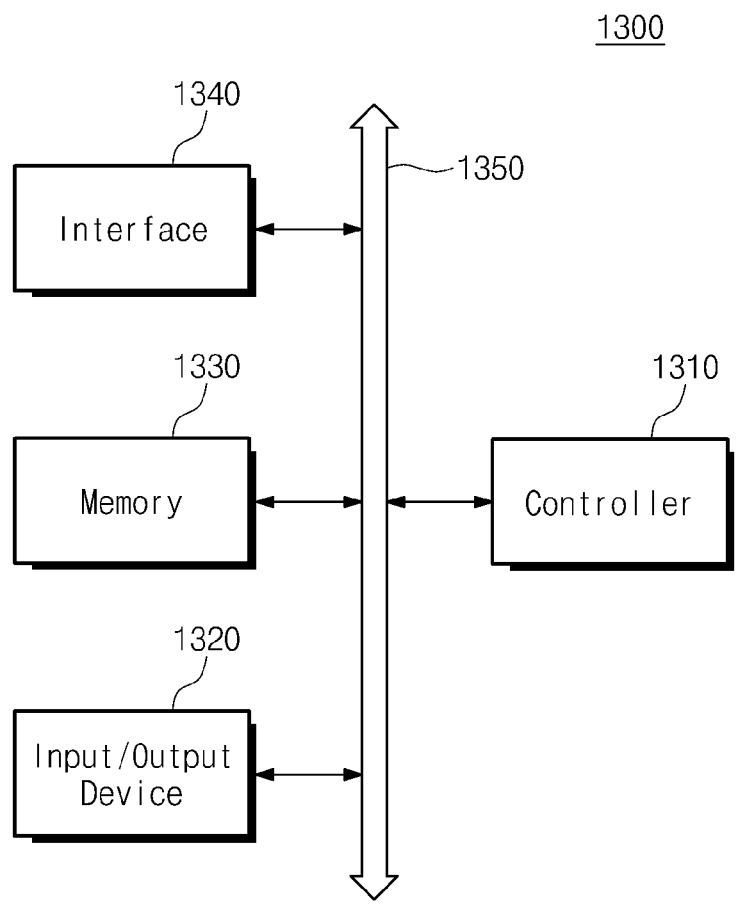
FIG. 8 is a schematic block diagram illustrating an example of an electronic system including a semiconductor package according to some embodiments.
Figure 9:
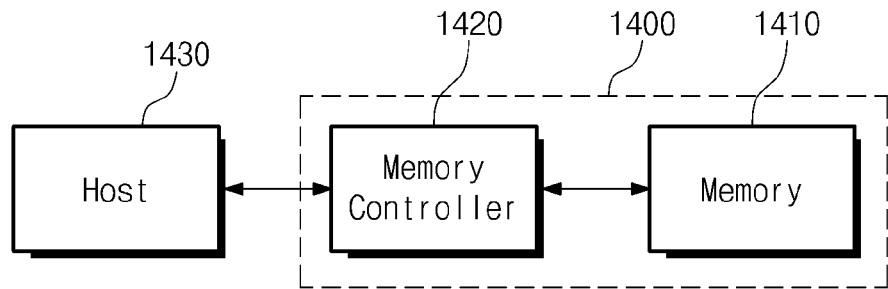
FIG. 9 is a schematic block diagram illustrating an example of a memory card including a semiconductor package according to some embodiments.

FIG. 7 is a schematic diagram illustrating an example of a package module including a semiconductor package according to some embodiments. FIG. 8 is a schematic block diagram illustrating an example of an electronic system including a semiconductor package according to some embodiments. FIG. 9 is a schematic block diagram illustrating an example of a memory card including a semiconductor package according to some embodiments.

Referring to FIG. 7, a package module 1200 may include one or more first semiconductor device 1220 and a second semiconductor device 1230 packaged using a quad flat package (QFP) technique. The semiconductor devices 1220 and 1230 may include at least one of semiconductor packages 1, 2, or other semiconductor packages according to the aforementioned embodiments. The package module 1200 may be connected to an external electronic device through external connection terminals 1240 provided on a side of a board 1210.

Referring to FIG. 8, an electronic system 1300 may include a controller 1310, an input/output (I/O) device 1320, and a memory device 1330. The controller 1310, the I/O device 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, and other logic devices having a similar function to any one thereof. At least one of the controller 1310, the I/O device 1320, the memory device 1330, and the interface 1340 may include at least one of the semiconductor packages 1, 2, or other semiconductor packages according to the aforementioned embodiments. The I/O device 1320 may include at least one of a keypad, a keyboard, or a display device. The memory device 1330 is a device storing data. The memory device 1330 may store data and/or commands executed by the controller 1310. The memory device 1330 may include at least one of a volatile memory device and a non-volatile memory device. In some embodiments, the memory device 1330 may include a flash memory device. For example, the flash memory device implemented with the technique may be installed in an information processing system such as a mobile device or a desk top computer. The flash memory device may be realized as solid state disks (SSD). In this case, the electronic system 1300 may stably store massive data in the memory device 1330. The electronic system 1300 may further include an interface unit 1340 configured to transmit electrical data to a communication network or receive electrical data from a communication network. The interface unit 1340 may operate by wireless or cable. For example, the interface unit 1340 may include an antenna or a wireless/cable transceiver. Although not shown in the drawings, the electronic system 1300 may further include an application chipset and/or a camera image processor (CIS).

The electronic system 1300 may be realized as a mobile system, a personal computer, an industrial computer, or a multi-functional logic system. For example, the mobile system may be one of a personal digital assistant (PDA), a portable computer, a web tablet, a wireless phone, a mobile phone, a laptop computer, a digital music player, a memory card, or an information transmitting/receiving system. If the electronic system 1300 is an apparatus capable of performing a wireless communication, the electronic system 1300 may be used in a communication interface protocol such as a third generation communication system (e.g., CDMA, GSM, NADC, E-TDMA, WCDMA, CDMA2000).

Referring to FIG. 9, a memory card 1400 may include a non-volatile memory device 1410 and a memory controller 1420. The non-volatile memory device 1410 and the memory controller 1420 may be configured to store data or read stored data. At least one of the memory device 1410 and the memory controller 1420 may include at least one of the semiconductor packages 1, 2, or other semiconductor packages according to the aforementioned embodiments. The memory controller 1420 may be configured to read data from and store data into the non-volatile memory device 1410 in response to read/write request of a host 1430.

According to some embodiments, the heat dissipation part may be disposed on the top surface of the first semiconductor chip. When the first semiconductor chip is operated, the heat generated from the heat source may be transferred to the heat dissipation part through the first semiconductor chip. Thus, heat may be more uniformly distributed in the first semiconductor chip.

The heat dissipation part may be spaced apart from the bottom surface of the second semiconductor chip mounted on the first semiconductor chip. Thus, the heat generated from the heat source of the first semiconductor chip may not be transferred to the second semiconductor chip. In other words, the crack may not be caused in the second semiconductor chip, so the second integrated circuit of the second semiconductor chip may not be damaged. The position of the second integrated circuit may not be limited by the position of the heat dissipation part but may be variously changed.

The heat dissipation part, the connecting pad, and the alignment key may be formed by the same process, so the semiconductor package may be easily fabricated.

Embodiments include a semiconductor package capable of improving heat dissipation efficiency and a method of fabricating the same.

Embodiments include a semiconductor package capable of increasing the degree of freedom of arrangement of an integrated circuit included in a semiconductor chip and a method of fabricating the same.

In an embodiment, a semiconductor package may include: a substrate; a first semiconductor chip mounted on the substrate; a second semiconductor chip mounted on a top surface of the first semiconductor chip; a connecting bump disposed between the first and second semiconductor chips to electrically connect the second semiconductor chip to the first semiconductor chip; and a thermal pad disposed on the top surface of the first semiconductor chip and spaced apart from a bottom surface of the second semiconductor chip.

In some embodiments, the semiconductor package may further include: a connecting pad disposed on the top surface of the first semiconductor chip. The connecting pad may be in contact with the connecting bump.

In some embodiments, the thermal pad may include the same material as the connecting pad.

In some embodiments, a thickness of the thermal pad may be equal to a thickness of the connecting pad.

In some embodiments, the first semiconductor chip may include a through-via, and the connecting pad may be electrically connected to the through-via.

In some embodiments, the semiconductor package may further include: an alignment key disposed on the top surface of the first semiconductor chip. The alignment key may include the same material as the thermal pad, and a thickness of the alignment key may be equal to a thickness of the thermal pad.

In some embodiments, the semiconductor package may further include: a thermal bump disposed on the thermal pad. The thermal bump may be spaced apart from the bottom surface of the second semiconductor chip.

In some embodiments, the semiconductor package may further include: an insulating pattern provided between the first and second semiconductor chips and covering sidewalls of the connecting bump. The insulating pattern may be provided between the thermal pad and the second semiconductor chip.

In some embodiments, the first semiconductor chip may include a heat source adjacent to a bottom surface of the first semiconductor chip. The thermal pad may overlap with the heat source when viewed from a plan view.

In some embodiments, the semiconductor package may further include: a third semiconductor chip mounted on a top surface of the second semiconductor chip; and a heat dissipation part disposed on the top surface of the second semiconductor chip and spaced apart from a bottom surface of the third semiconductor chip.

In some embodiments, the semiconductor package may further include: an upper bump disposed between the second and third semiconductor chips to electrically connect the third semiconductor chip to the second semiconductor chip. A height of the heat dissipation part may be lower than that of the upper bump.

In another aspect, a semiconductor package may include: a substrate; a first semiconductor chip mounted on the substrate; a second semiconductor chip disposed on the first semiconductor chip; a connecting bump disposed between the first and second semiconductor chips to electrically connect the second semiconductor chip to the first semiconductor chip; a first pad disposed on a top surface of the first semiconductor chip and being in contact with the connecting bump; and a second pad disposed on the top surface of the first semiconductor chip and spaced apart from a bottom surface of the second semiconductor chip.

In some embodiments, the second pad may include the same material as the first pad, and a thickness of the second pad may be equal to that of the first pad.

In some embodiments, the semiconductor package may further include: a thermal bump disposed on the second pad. The thermal bump may be spaced apart from the bottom surface of the second semiconductor chip.

In some embodiments, the semiconductor package may further include: an alignment key disposed on the top surface of the first semiconductor chip. The alignment key may include the same material as the first and second pads.

In some embodiments, the second semiconductor chip may include integrated circuits adjacent to the bottom surface of the second semiconductor chip. At least one of the integrated circuits may overlap with the second pad when viewed from a plan view.

In another embodiment, a method of fabricating a semiconductor package may include: preparing a first semiconductor chip including a thermal pad; mounting the first semiconductor chip on a substrate; and mounting a second semiconductor chip on a top surface of the first semiconductor chip. The second semiconductor chip may be electrically connected to the first semiconductor chip through a connecting bump. The thermal pad may be disposed on the top surface of the first semiconductor chip and may be spaced apart from a bottom surface of the second semiconductor chip.

In some embodiments, preparing the first semiconductor chip may include: forming a conductive layer on the top surface of the first semiconductor chip; and patterning the conductive layer to form the thermal pad, a connecting pad, and an alignment key. The connecting pad and the alignment key may be spaced apart from the thermal pad.

In some embodiments, preparing the first semiconductor chip may further include: forming a thermal bump on the thermal pad. A height of the thermal bump may be lower than that of the connecting bump.

In some embodiments, mounting the second semiconductor chip may further include: bringing the connecting bump into contact with the connecting pad. The connecting bump may be spaced apart from the thermal pad.

While the embodiments have been described with reference to particular embodiments, it will be apparent to those skilled in the art that various changes and modifications may be made without departing from the spirit and scope. Therefore, it should be understood that the above embodiments are not limiting, but illustrative. Thus, the scope is to be determined by the broadest permissible interpretation of the following claims and their equivalents, and shall not be restricted or limited by the foregoing description.

What is claimed is:

1. A semiconductor package comprising:
   a substrate;
   a first semiconductor chip mounted on the substrate;
   a second semiconductor chip mounted on a top surface of the first semiconductor chip;
   a connecting bump disposed between the first and second semiconductor chips to electrically connect the second semiconductor chip to the first semiconductor chip;
   a first heat dissipation part disposed on the top surface of the first semiconductor chip between the first semiconductor chip and the second semiconductor chip and spaced apart from a bottom surface of the second semiconductor chip; and
   an insulating pattern provided between the first semiconductor chip and the second semiconductor chip and covering a sidewall of the connecting bump;
   wherein:
   the insulating pattern is disposed between an uppermost surface of the first heat dissipation part and the bottom surface of the second semiconductor chip;
   the insulating pattern covers a sidewall of the first heat dissipation part;
   a thickness of the insulating pattern on the uppermost surface of the first heat dissipation part is smaller than a distance between the top surface of the first semiconductor chip and the bottom surface of the second semiconductor chip;
   the first heat dissipation part includes a thermal pad;
   the first heat dissipation part further comprises a thermal bump disposed on the thermal pad;
   the thermal bump is spaced apart from all conductive structures on the bottom surface of the second semiconductor chip; and
   a height of the thermal bump is lower than a height of the connecting bump.

2. The semiconductor package of claim 1, further comprising:
   a connecting pad disposed on the top surface of the first semiconductor chip,
   wherein the connecting pad is in contact with the connecting bump.

3. The semiconductor package of claim 2,
   wherein the thermal pad includes the same material as the connecting pad.

4. The semiconductor package of claim 2,
   wherein a thickness of the thermal pad is equal to a thickness of the connecting pad.

5. The semiconductor package of claim 1, further comprising:
   an alignment key disposed on the top surface of the first semiconductor chip,
   wherein:
   the alignment key includes the same material as the thermal pad, and
   a thickness of the alignment key is equal to a thickness of the thermal pad.

6. The semiconductor package of claim 1, wherein:
   the first semiconductor chip comprises a through-via, and
   the connecting bump is electrically connected to the through-via.

7. The semiconductor package of claim 1, wherein:
   the first semiconductor chip comprises a first heat source adjacent to a bottom surface of the first semiconductor chip, and
   the first heat dissipation part overlaps with the first heat source when viewed from a plan view.

8. The semiconductor package of claim 7, wherein:
   the first semiconductor chip comprises a second heat source adjacent to the bottom surface of the first semiconductor chip, and the first heat dissipation part overlaps with the first heat source and the second heat source when viewed from a plan view.

9. The semiconductor package of claim 1, further comprising:
a third semiconductor chip mounted on a top surface of the second semiconductor chip; and
a second heat dissipation part disposed on the top surface of the second semiconductor chip and spaced apart from a bottom surface of the third semiconductor chip.

10. The semiconductor package of claim 9, further comprising:
an upper bump disposed between the second and third semiconductor chips to electrically connect the third semiconductor chip to the second semiconductor chip,
wherein a height of the second heat dissipation part is lower than that of the upper bump.

11. The semiconductor package of claim 9, wherein:
the first semiconductor chip comprises a first through-via, wherein the connecting bump is electrically connected to the first through-via;
the second semiconductor chip comprises a second through-via, the connecting bump is electrically connected to the second through-via; and
the third semiconductor chip comprises a non through-via semiconductor chip.

12. The semiconductor package of claim 1, wherein:
the second semiconductor chip comprises integrated circuits adjacent to the bottom surface of the second semiconductor chip, and
at least one of the integrated circuits overlaps with the first heat dissipation part when viewed from a plan view.

13. A semiconductor package comprising:
a substrate;
a first semiconductor chip disposed on the substrate, wherein the first semiconductor chip comprises a through-via;
a second semiconductor chip disposed on the first semiconductor chip;
a connecting bump disposed between the first semiconductor chip and the second semiconductor chip to electrically connect the second semiconductor chip to the first semiconductor chip, wherein the connecting bump is electrically connected to the through-via;
a first pad disposed between the first semiconductor chip and the connecting bump; and
a heat dissipation part disposed on a top surface of the first semiconductor chip between the first semiconductor chip and the second semiconductor chip and spaced apart from a bottom surface of the second semiconductor chip,
wherein the heat dissipation part includes a second pad disposed on the first semiconductor chip and a thermal bump disposed on the second pad; and
an insulating pattern provided between the first semiconductor chip and the second semiconductor chip and covering sidewalls of the connecting bump;
wherein:
the insulating pattern is disposed between an uppermost surface of the heat dissipation part and the bottom surface of the second semiconductor chip;
the uppermost surface of the heat dissipation part is disposed at a higher level than the top surface of the first semiconductor chip;

the thermal bump is spaced apart from all conductive structures on the bottom surface of the second semiconductor chip; and
a height of the thermal bump is lower than a height of the connecting bump.

14. The semiconductor package of claim 13, wherein:
the second pad includes the same material as the first pad, and
wherein a thickness of the second pad is equal to that of the first pad.

15. A semiconductor package comprising:
a substrate;
a first semiconductor chip disposed on the substrate;
a second semiconductor chip disposed on the first semiconductor chip;
a third semiconductor chip mounted on a top surface of the second semiconductor chip;
a connecting bump disposed between the first semiconductor chip and the second semiconductor chip to electrically connect the second semiconductor chip to the first semiconductor chip;
a first pad disposed between the first semiconductor chip and the connecting bump; and
a thermal dissipation part disposed on a top surface of the first semiconductor chip between the first semiconductor chip and the second semiconductor chip and spaced apart from a bottom surface of the second semiconductor chip,
wherein the thermal dissipation part includes a thermal pad disposed on the first semiconductor chip and a thermal bump disposed on the thermal pad;
an insulating pattern provided between the first semiconductor chip and the second semiconductor chip and covering a sidewall of the connecting bump;
wherein:
the thermal bump is spaced apart from all conductive structures on the bottom surface of the second semiconductor chip;
the insulating pattern is disposed between an uppermost surface of the thermal bump and the bottom surface of the second semiconductor chip;
the insulating pattern covers a sidewall of the thermal dissipation part;
the uppermost surface of the thermal bump is disposed at a higher level than the top surface of the first semiconductor chip;
a thickness of the insulating pattern on the uppermost surface of the thermal bump is smaller than a distance between the top surface of the first semiconductor chip and the bottom surface of the second semiconductor chip;
the first semiconductor chip comprises a first through-via, wherein the connecting bump is electrically connected to the first through-via;
the second semiconductor chip comprises a second through-via, the connecting bump is electrically connected to the second through-via;
the third semiconductor chip comprises a non through-via semiconductor chip; and
a height of the thermal bump is lower than a height of the connecting bump.

* * * * *